(12) United States Patent
Huang et al.

(10) Patent No.: US 8,951,921 B2
(45) Date of Patent: Feb. 10, 2015

(54) METHOD OF FORMING THIN FILM POLY SILICON LAYER AND METHOD OF FORMING THIN FILM TRANSISTOR

(71) Applicant: Wintek Corporation, Taichung (TW)

(72) Inventors: Hieng-Hsiung Huang, Hsinchu (TW);
Wen-Chun Wang, Taichung (TW);
Heng-Yi Chang, Taipei (TW);
Chin-Chang Liu, Taichung (TW)

(73) Assignee: Wintek Corporation, Tanzi Dist., Taichung (TW)

( * ) Notice: Subject to any disclaimer, the term of this patent is extended or adjusted under 35 U.S.C. 154(b) by 0 days.

(21) Appl. No.: 13/912,199

(22) Filed: Jun. 7, 2013

(65) Prior Publication Data

US 2013/0330886 A1    Dec. 12, 2013

(30) Foreign Application Priority Data

Jun. 8, 2012 (TW) .............. 101120669 A
Jul. 18, 2012 (TW) .............. 101125823 A
Oct. 3, 2012 (TW) .............. 101136512 A

(51) Int. Cl.
 *H01L 21/02* (2006.01)
 *H01L 29/786* (2006.01)
 (Continued)

(52) U.S. Cl.
 CPC ........ *H01L 29/78672* (2013.01); *C23C 14/024* (2013.01); *C23C 14/025* (2013.01); *C23C 14/185* (2013.01); *C23C 16/0209* (2013.01); *C23C 16/0272* (2013.01); *C23C 16/0281* (2013.01); *C23C 16/24* (2013.01); *C30B 29/06* (2013.01); *H01L 21/02422* (2013.01); *H01L 21/02532* (2013.01); *H01L 21/02595* (2013.01);

(Continued)

(58) Field of Classification Search
None
See application file for complete search history.

(56) References Cited

U.S. PATENT DOCUMENTS 5,026,574 A  *  6/1991  Economu et al. ............. 438/488
5,523,587 A        6/1996  Kwo
(Continued)

FOREIGN PATENT DOCUMENTS

EP  0 606 751 A1  7/1994
EP  0 631 297 A2  12/1994
WO  9828463 A1  7/1998

OTHER PUBLICATIONS

N. N. Chubun et al., Fabrication and characterization of singly addressable arrays of polysilicon field-emission cathodes, Solid-State Electronics 45, Jun. 2001, pp. 1003-1007, ISSN: 0038-1101, XP004359040, 2001 Elsevier Science Ltd.

(Continued)

*Primary Examiner* — Charles Garber
*Assistant Examiner* — Alia Sabur
(74) *Attorney, Agent, or Firm* — Winston Hsu; Scott Margo

(57) ABSTRACT

A method of forming a thin film poly silicon layer includes following steps. Firstly, a substrate is provided. A heating treatment is then performed. A thin film poly silicon layer is then directly formed on a first surface of the substrate by a silicon thin film deposition process. A method of forming a thin film transistor includes following steps. Firstly, a substrate is provided. A heating treatment is then performed. A thin film poly silicon layer is then directly formed on a first surface of the substrate by a silicon thin film deposition process. A first patterning process is performed on the thin film poly silicon layer to form a semiconductor pattern. Subsequently, a gate insulation layer, a gate electrode, a source electrode and a drain electrode are formed.

24 Claims, 27 Drawing Sheets

(51) Int. Cl.
  *C23C 14/02* (2006.01)
  *C23C 14/18* (2006.01)
  *C23C 16/02* (2006.01)
  *C23C 16/24* (2006.01)
  *C30B 29/06* (2006.01)
  *H01L 29/66* (2006.01)

(52) U.S. Cl.
  CPC ...... *H01L 21/0262* (2013.01); *H01L 21/02658* (2013.01); *H01L 29/66757* (2013.01); *H01L 29/78675* (2013.01); *H01L 29/66765* (2013.01); *H01L 29/78678* (2013.01); *C03C 2218/152* (2013.01); *C03C 2218/153* (2013.01); *C03C 2218/154* (2013.01)
  USPC ........................................................ 438/778

(56) References Cited

U.S. PATENT DOCUMENTS

| | | | |
|---|---|---|---|
| 6,281,098 B1 * | 8/2001 | Wang et al. | 438/488 |
| 2002/0132411 A1 * | 9/2002 | Meiling et al. | 438/205 |
| 2003/0180991 A1 | 9/2003 | Seo | |
| 2004/0099863 A1 * | 5/2004 | Chen | 257/66 |
| 2004/0130005 A1 * | 7/2004 | Guzman et al. | 257/636 |
| 2005/0012097 A1 | 1/2005 | Yamazaki | |
| 2005/0074930 A1 * | 4/2005 | Chen et al. | 438/151 |
| 2006/0088961 A1 * | 4/2006 | Jung et al. | 438/149 |
| 2007/0077735 A1 * | 4/2007 | Peng et al. | 438/486 |
| 2007/0105373 A1 * | 5/2007 | Wang et al. | 438/680 |
| 2008/0164475 A1 | 7/2008 | Choi | |
| 2011/0226316 A1 * | 9/2011 | Campbell et al. | 136/255 |

OTHER PUBLICATIONS

David Lysáček et al., Gettering and Defect Engineering in Semiconductor Technology XIV, Polycrystalline silicon layers with enhanced thermal stability, Solid State Phenomena vols. 178-179, Aug. 2011, pp. 385-391, XP009171921, 2011 Trans Tech Publications, Switzerland.

* cited by examiner

METHOD OF FORMING THIN FILM POLY SILICON LAYER AND METHOD OF FORMING THIN FILM TRANSISTOR

BACKGROUND OF THE INVENTION

1. Field of the Invention

The present invention relates to a method of forming a thin film poly silicon layer and a method of forming a thin film transistor, and more particularly, to a method of directly forming a thin film poly silicon layer on a substrate instead of crystallizing an amorphous silicon layer by laser annealing after depositing the amorphous silicon layer, and a method of forming a thin film transistor including the method of forming the thin film poly silicon layer.

2. Description of the Prior Art

In recent years, applications of flat display devices are rapidly developed. Electronics, such as televisions, cell phones, mobiles, and refrigerators, are installed with flat display devices. A thin film transistor (TFT) is a kind of semiconductor devices commonly used in the flat display device, such as a liquid crystal display (LCD), an organic light emitting diode (OLED) display, and an electronic paper (E-paper).

The thin film transistors in current display industries mainly include amorphous silicon thin film transistors (a-Si TFTs) and poly silicon thin film transistors. The amorphous silicon thin film transistor is currently the mainstream thin film transistor applied in the display industry because of its mature process techniques and high yield. However, the amorphous silicon thin film transistor may not be good enough to satisfy requirements of foreseeable high performance display devices, because the electrical mobility of the amorphous silicon thin film transistor, which is mainly determined by material properties of amorphous silicon, can not be effectively improved by process tuning or design modification. The electrical mobility of the poly silicon thin film transistor is much better because of material properties of poly silicon. In a conventional method of forming a thin film poly silicon layer, an amorphous silicon layer is formed and a thin film poly silicon layer may be obtained after crystallizing the amorphous silicon layer by high temperature or high energy treatments such as laser annealing. However, the crystallization process after the film deposition has several disadvantages such as longer process time, higher cost, and lower manufacturing efficiency. In addition, the uniformity of the crystallization process on a large size substrate is still a problem needed to be solved, and the conventional method of forming the thin film poly silicon layer is accordingly limited to specific products and applications.

SUMMARY OF THE INVENTION

It is one of the objectives of the present invention to provide a method of forming a thin film poly silicon layer and a method of forming a thin film transistor. The thin film poly silicon layer may be directly formed on a substrate by performing a silicon thin film deposition process on the substrate when the substrate is heated to a temperature for forming the thin film poly silicon layer. The thin film poly silicon layer is then used to form a thin film transistor.

To achieve the purposes described above, a preferred embodiment of the present invention provides a method of forming a thin film poly silicon layer. The method of forming the thin film poly silicon layer includes following steps. Firstly, a substrate is provided. The substrate has a first surface. A heating treatment is then performed. A silicon thin film deposition process is then performed for directly forming a thin film poly silicon layer on the first surface of the substrate.

To achieve the purposes described above, a preferred embodiment of the present invention provides a method of forming a thin film poly silicon layer. The method of forming the thin film poly silicon layer includes following steps. Firstly, a substrate is provided. The substrate includes a substrate basis and a lattice matching layer. The lattice matching layer is disposed on the substrate basis. A heating treatment is then performed. A silicon thin film deposition process is then performed for directly forming a thin film poly silicon layer on a first surface of the substrate.

To achieve the purposes described above, a preferred embodiment of the present invention provides a method of forming a thin film transistor. The method of forming the thin film transistor includes following steps. Firstly, a substrate is provided. The substrate has a first surface. A heating treatment is then performed. A silicon thin film deposition process is then performed for directly forming a thin film poly silicon layer on the first surface of the substrate. A first patterning process is performed on the thin film poly silicon layer so as to form a semiconductor pattern. Subsequently, a gate electrode, a gate insulation layer, a source electrode and a drain electrode are formed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
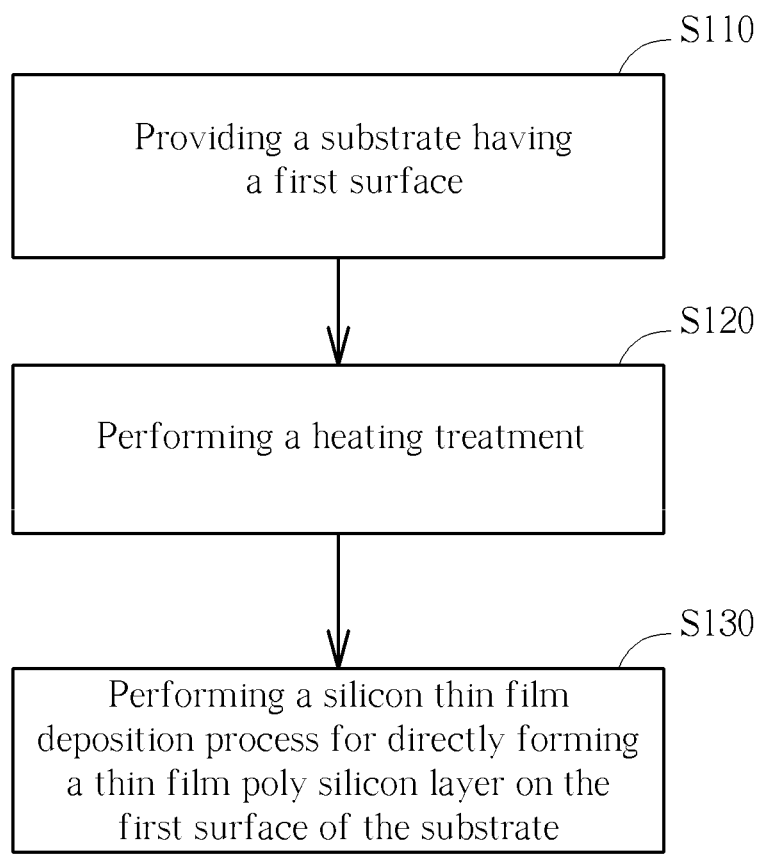
FIG. 1 is a flow chart of a method of forming a thin film poly silicon layer according to a first preferred embodiment of the present invention.
Figure 2:
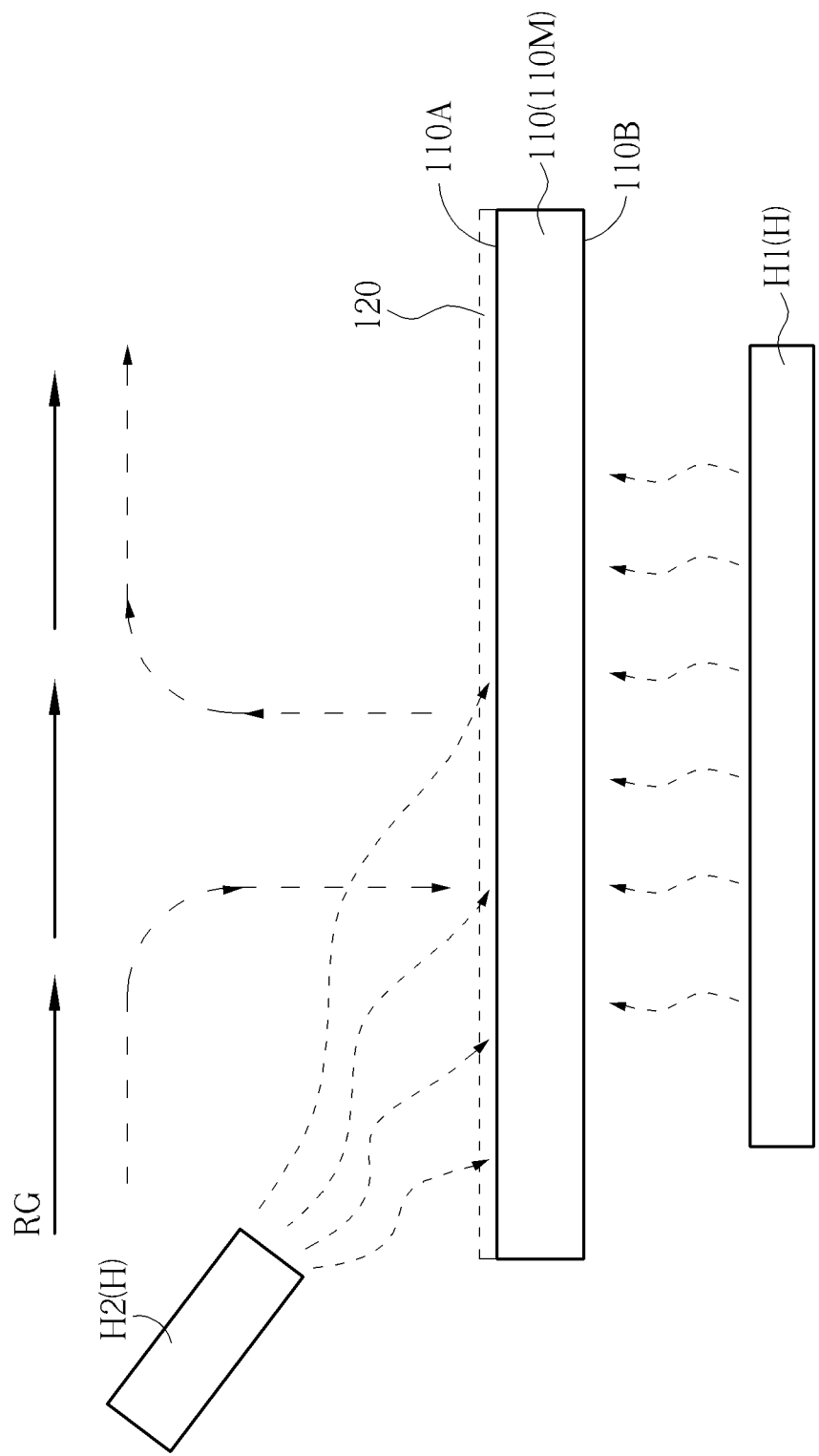
FIG. 2 is a schematic diagram illustrating the method of forming the thin film poly silicon layer according to the first preferred embodiment of the present invention.

Please refer to FIG. 1 and FIG. 2. FIG. 1 is a flow chart of a method of forming a thin film poly silicon layer according to a first preferred embodiment of the present invention, and FIG. 2 is a schematic diagram illustrating the method of this embodiment. Please note that the figures are only for illustration and the figures may not be to scale. The scale may be further modified according to different design considerations. As shown in FIG. 1 and FIG. 2, the first preferred embodiment of the present invention provides a method of forming a thin film poly silicon layer. The method of forming the thin film poly silicon layer includes the following steps. Firstly, in step S110, a substrate 110 is provided. The substrate 110 has a first surface 110A and a second surface 110B. In addition, the substrate 110 in this embodiment may preferably include a substrate basis 110M. The substrate basis 110M may preferably include a glass substrate basis, a ceramic substrate basis, or other substrate bases made of appropriate materials. Subsequently, in step S120, a heating treatment is performed. The heating treatment in this embodiment includes heating the substrate 110 to a temperature higher than 450 degrees Celsius by a heating source H. Preferably, the heating treatment is used to heat the substrate 110 to a temperature higher than 500 degrees Celsius by the heating source H. The heating source H may preferably include a light heating source, an ion beam heating source, an electrode beam heating source, a furnace tube heating source or a filament heating source. In further descriptions, the heating source H of this embodiment may preferably include a main heating source H1 and an auxiliary heating source H2, but not limited thereto. The heating treatment mentioned above may preferably include heating the substrate 110 to a first temperature by the main heating source H1, and heating the first surface 110A of the substrate 110 to a second temperature by the auxiliary heating source H2, but not limited thereto. Additionally, the second temperature is preferably higher than the first temperature. For example, the first temperature is preferably higher than 200 degrees Celsius. The second temperature is higher than 450 degrees Celsius, and the second temperature is preferably higher than 500 degrees Celsius, but not limited thereto. Subsequently, in step S130, a silicon thin film deposition process is then performed for directly forming a thin film poly silicon layer 120 on the first surface 110A of the substrate 110. Because the first surface 110A of the substrate 110 is heated to a temperature which is high enough for directly forming a thin film poly silicon layer, the thin film poly silicon layer 120 may be directly formed on the first surface 110A accordingly.

As shown in FIG. 2, the silicon thin film deposition process of this embodiment is preferably a chemical vapor deposition (CVD) process, such as a plasma enhanced chemical vapor deposition (PECVD) process, a metal-organic chemical vapor deposition (MOCVD) process, or a low pressure chemical vapor deposition (LPCVD) process, but not limited thereto. In the silicon thin film deposition process of this embodiment, a reactive gaseous material RG is used to provide a source of silicon, and a thin film silicon layer may be formed on the first surface 110A of the substrate 110. For example, in the silicon thin film deposition process of this embodiment, the reactive gaseous material RG preferably includes silane ($SiH_4$) or dichlorosilane ($SiH_2Cl_2$), which may be dissociated for forming the thin film silicon layer on the substrate 110. Because the first surface 110A of the substrate 110 is already heated to the temperature, which is high enough for directly forming a thin film poly silicon layer, by the auxiliary heating source H2, the thin film poly silicon layer 120 may be directly formed on the first surface 110A of the substrate 110. Other crystallization processes such as a laser annealing process after the silicon thin film deposition process will not be required in this embodiment. Therefore, the method of forming the thin film poly silicon layer in this embodiment has advantages such as reduced process time, lower cost, and higher manufacturing efficiency. Additionally, the uniformity of the thin film poly silicon layer formed by the method of this embodiment is improved because the thin film poly silicon layer 120 is directly formed by the silicon thin film deposition process. The method of forming the thin film poly silicon layer in this embodiment is suitable for large size substrates accordingly.

It is worth noting that, apart from heating the first surface 110A of the substrate 110 to the second temperature by the auxiliary heating source H2 before the silicon thin film deposition process in the method of forming the thin film poly silicon layer of this embodiment, the auxiliary heating source H2 may also be selectively employed to continuously heat the first surface 110A and the deposited thin film silicon layer in an initial stage or other periods of the silicon thin film deposition process so as to further improve the crystallization quality of the thin film poly silicon layer 120. In addition, the auxiliary heating source H2 in this embodiment may preferably include a high energy heating source such as a light heating source, an ion beam heating source, an electrode beam heating source, a furnace tube heating source or a filament heating source, and the main heating source H1 in this embodiment may preferably include a susceptor heating source, a radio frequency (RF) heating source, or a infrared (IR) heating source, but the present invention is not limited to this. Other appropriate heating sources may also be selectively employed as the main heating source H1 and the auxiliary heating source H2 for different heating considerations. In this embodiment, the first surface 110A of the substrate 110 is mainly heated to the second temperature for forming the thin film poly silicon layer 120. Other parts of the substrate 110 are not required to be heated to the second temperature. The heat-resistant property of the substrate 110 may not be strictly requested accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
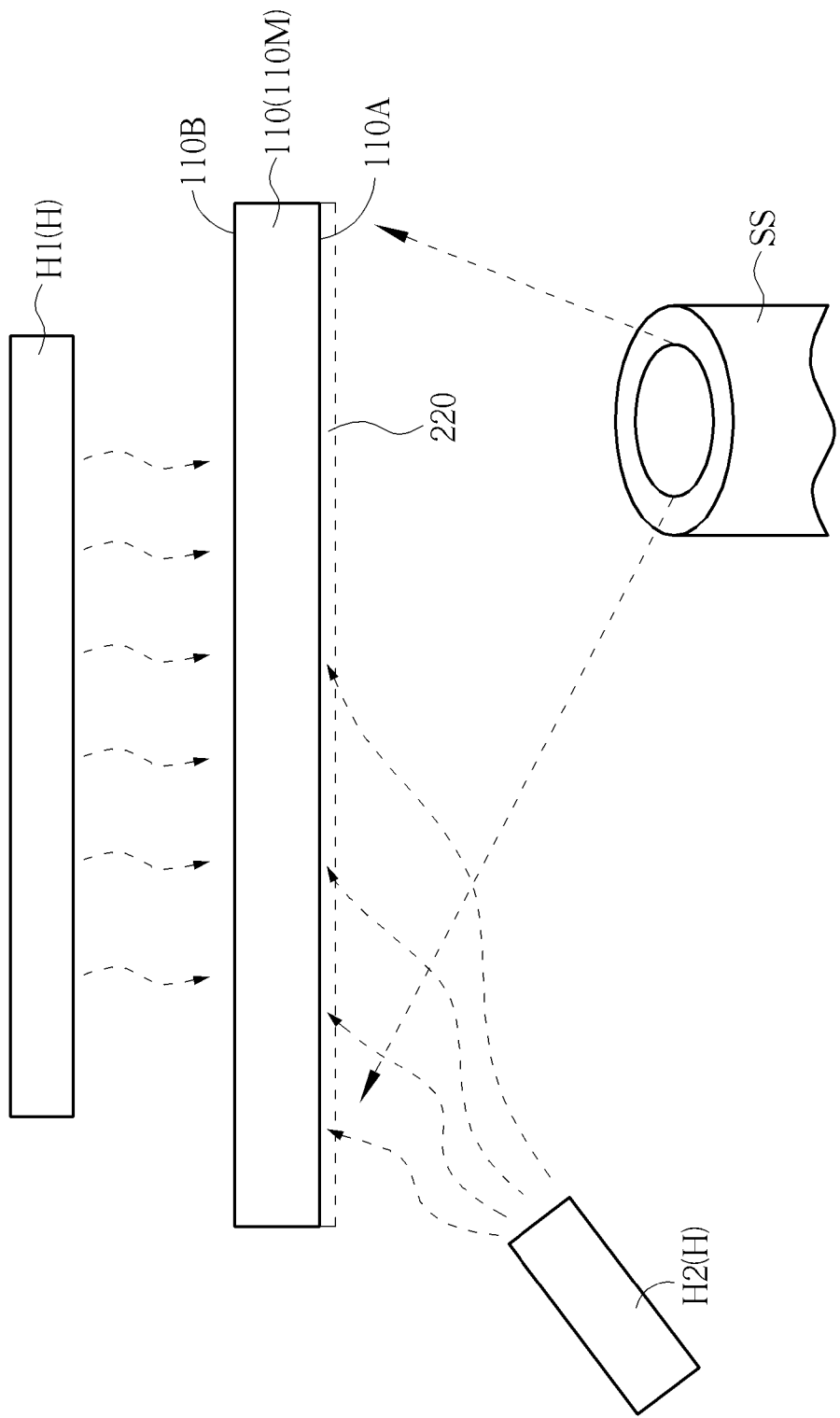
FIG. 3 is a schematic diagram illustrating a method of forming a thin film poly silicon layer according to a second preferred embodiment of the present invention.

Please refer to FIG. 3 and FIG. 1. FIG. 3 is a schematic diagram illustrating a method of forming a thin film poly silicon layer according to a second preferred embodiment of the present invention. As shown in FIG. 1 and FIG. 3, the difference between the method of forming the thin film poly silicon layer in this embodiment and the method of the first preferred embodiment is that the silicon thin film deposition process of this embodiment is preferably a physical vapor deposition (PVD) process, and a silicon source SS such as a silicon target may be employed for sputtering a silicon layer on the first surface 110A of the substrate 110. Because the first surface 110A of the substrate 110 is already heated to the second temperature, which is high enough for directly forming a thin film poly silicon layer, by the auxiliary heating source H2, a thin film poly silicon layer 220 may be directly formed on the first surface 110A of the substrate 110. Other crystallization processes after the silicon thin film deposition process will not be required in this embodiment. Apart from the type of the silicon thin film deposition process in this embodiment, the other components, allocations, material properties, and the heating treatment in this embodiment are similar to those of the method of forming the thin film poly silicon layer in the first preferred embodiment detailed above and will not be redundantly described. It is worth noting that, apart from heating the first surface 110A of the substrate 110 to the second temperature by the auxiliary heating source H2 before the silicon thin film deposition process in the method of forming the thin film poly silicon layer of this embodiment, the auxiliary heating source H2 may also be selectively employed to continuously heat the first surface 110A and the deposited thin film silicon layer in an initial stage or other periods of the silicon thin film deposition process so as to further improve the crystallization quality of the thin film poly silicon layer 220.

Figure 4:
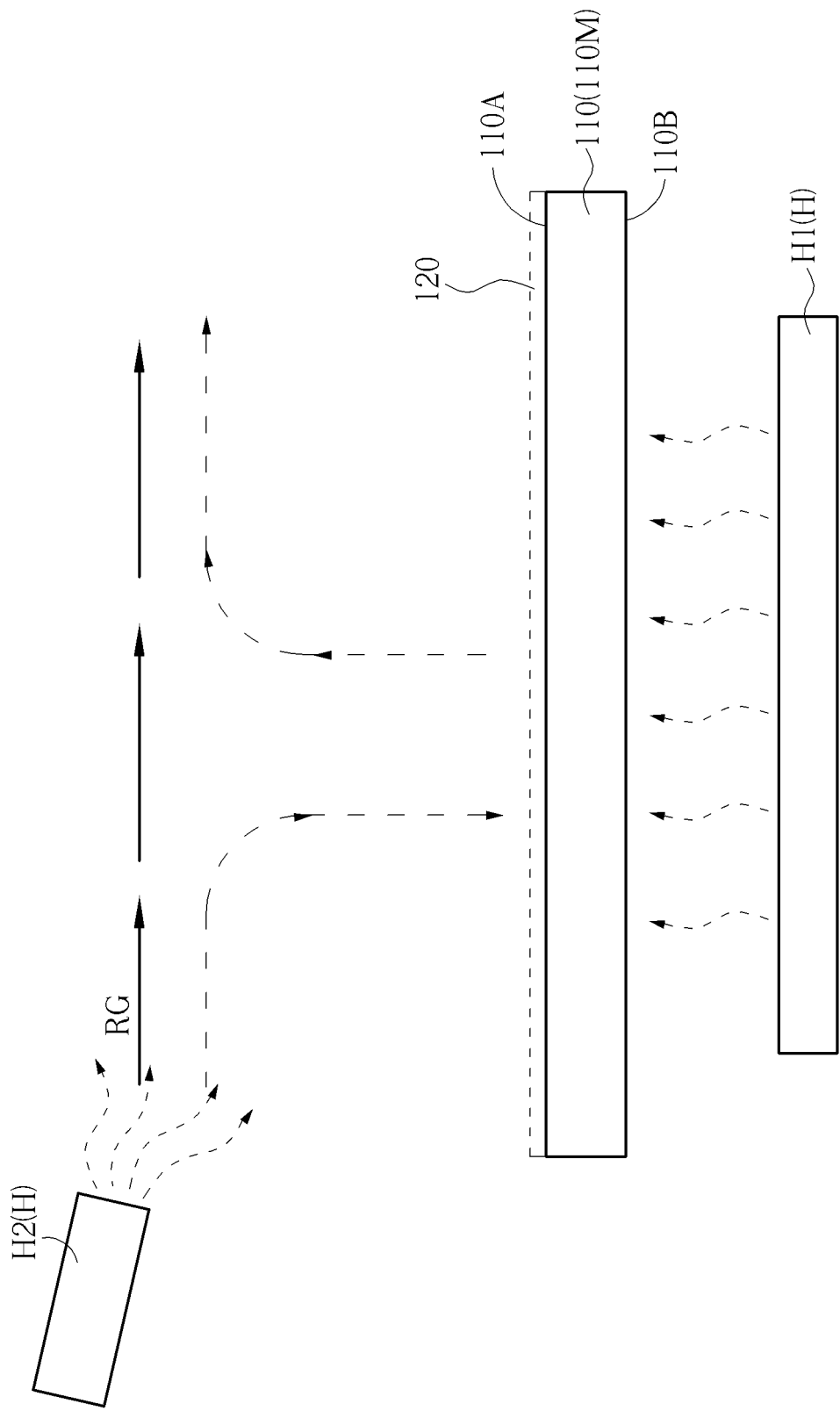
FIG. 4 is a schematic diagram illustrating a method of forming a thin film poly silicon layer according to a third preferred embodiment of the present invention.

Please refer to FIG. 4. FIG. 4 is a schematic diagram illustrating a method of forming a thin film poly silicon layer according to a third preferred embodiment of the present invention. As shown in FIG. 4, in the silicon thin film deposition process of this embodiment, a reactive gaseous material RG is preferably employed for forming the thin film poly silicon layer 120 on the first surface 110A of the substrate. The reactive gaseous material RG preferably includes silane or dichlorosilane, but not limited thereto. The difference between the method of forming the thin film poly silicon layer in this embodiment and the method of the first preferred embodiment is that the heating treatment in this embodiment may preferably include heating the substrate 110 to a first temperature by the main heating source H1, and heating the reactive gaseous material RG to a second temperature by the auxiliary heating source H2. The second temperature is preferably higher than the first temperature. For instance, the first temperature is preferably higher than 200 degrees Celsius, the second temperature is higher than 450 degrees Celsius, and the second temperature is preferably higher than 500 degrees Celsius, but not limited thereto. Because the reactive gaseous material RG is already heated to the second temperature, which is high enough for directly forming a thin film poly silicon layer, by the auxiliary heating source H2, the thin film poly silicon layer 120 may be directly formed on the first surface 110A of the substrate 110. Additionally, the auxiliary heating source H2 in this embodiment may preferably include a high energy heating source such as a light heating source, an ion beam heating source, an electrode beam heating source, a furnace tube heating source or a filament heating source, but not limited thereto. Apart from the heating treatment in this embodiment, the other components and material properties in this embodiment are similar to those of the method of forming the thin film poly silicon layer in the first preferred embodiment detailed above and will not be redundantly described. It is worth noting that, in other preferred embodiments of the present invention, the auxiliary heating source H2 may also be employed to heat both the first surface 110A of the substrate 110 and the reactive gaseous material RG so as to further enhance the crystallization quality of the thin film poly silicon layer 120.

Figure 5:
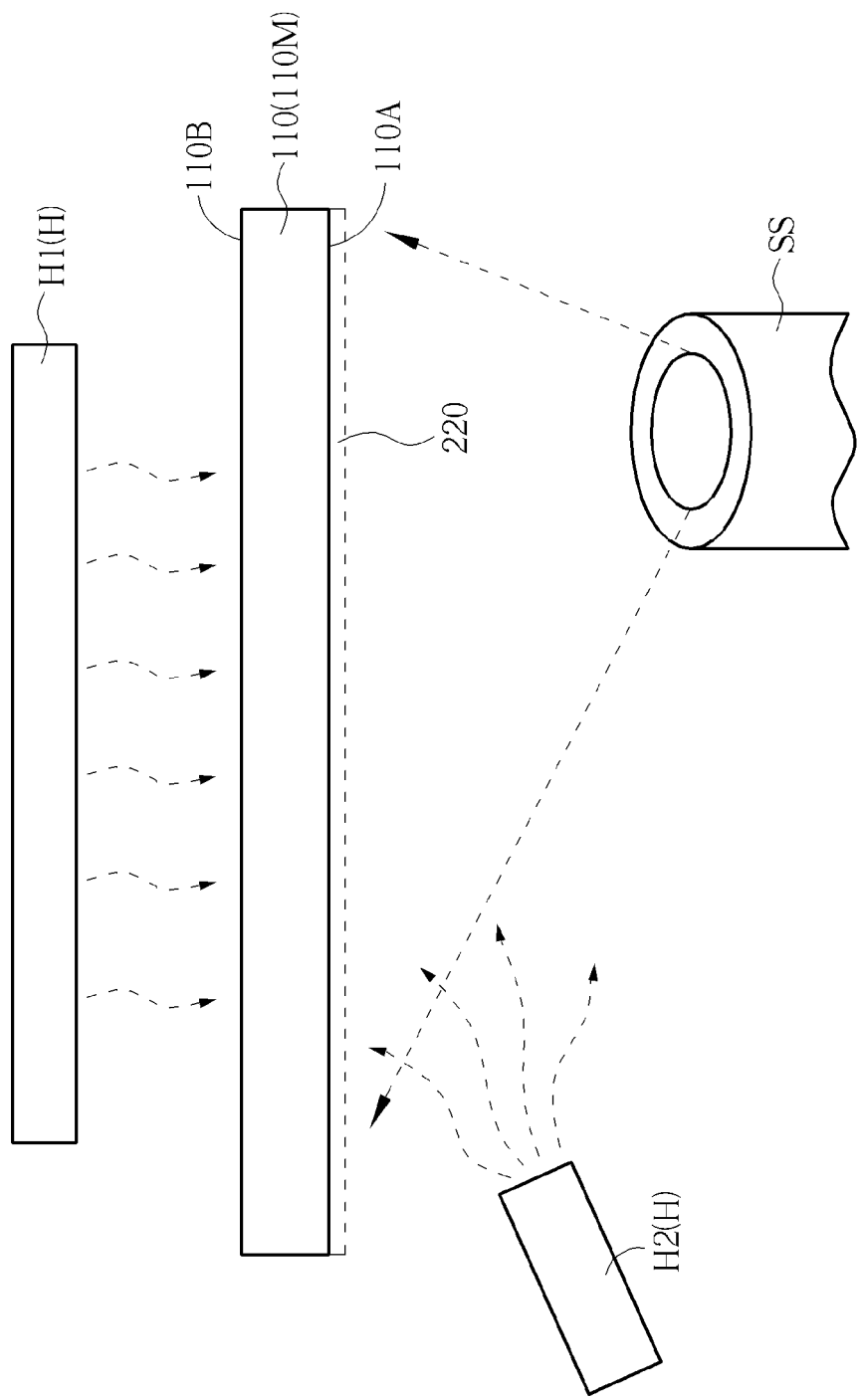
FIG. 5 is a schematic diagram illustrating a method of forming a thin film poly silicon layer according to a fourth preferred embodiment of the present invention.

Please refer to FIG. 5. FIG. 5 is a schematic diagram illustrating a method of forming a thin film poly silicon layer according to a fourth preferred embodiment of the present invention. As shown in FIG. 5, the silicon thin film deposition process of this embodiment is preferably a physical vapor deposition process, and the silicon source SS such as a silicon target is employed for sputtering a silicon layer on the first surface 110A of the substrate 110. The difference between the method of forming the thin film poly silicon layer in this embodiment and the method of the second preferred embodiment is that the heating treatment of this embodiment may preferably include heating the substrate 110 to a first temperature by the main heating source H1, and heating the silicon source SS in a stage before forming a silicon layer on the first surface 110A to a second temperature by the auxiliary heating source H2. The second temperature is preferably higher than the first temperature. For instance, the first temperature is preferably higher than 200 degrees Celsius, the second temperature is higher than 450 degrees Celsius, and the second temperature is preferably higher than 500 degrees Celsius, but not limited thereto. Because the silicon source SS in the stage before forming the silicon layer on the first surface 110A is already heated to the second temperature, which is high enough for directly forming a thin film poly silicon layer, by the auxiliary heating source H2, the thin film poly silicon layer 220 may be directly formed on the first surface 110A of the substrate 110. Additionally, the auxiliary heating source H2 in this embodiment may preferably include a high energy heating source such as a light heating source, an ion beam heating source, an electrode beam heating source, a furnace tube heating source or a filament heating source, but not limited thereto. Apart from the heating treatment in this embodiment, the other components and material properties in this embodiment are similar to those of the method of forming the thin film poly silicon layer in the second preferred embodiment detailed above and will not be redundantly described. It is worth noting that, in other preferred embodiments of the present invention, the auxiliary heating source H2 may also be employed to heat both the first surface 110A of the substrate 110 and the silicon source SS in the stage before forming the silicon layer on the first surface 110A to the second temperature so as to further enhance the crystallization quality of the thin film poly silicon layer 220.

Figure 6:
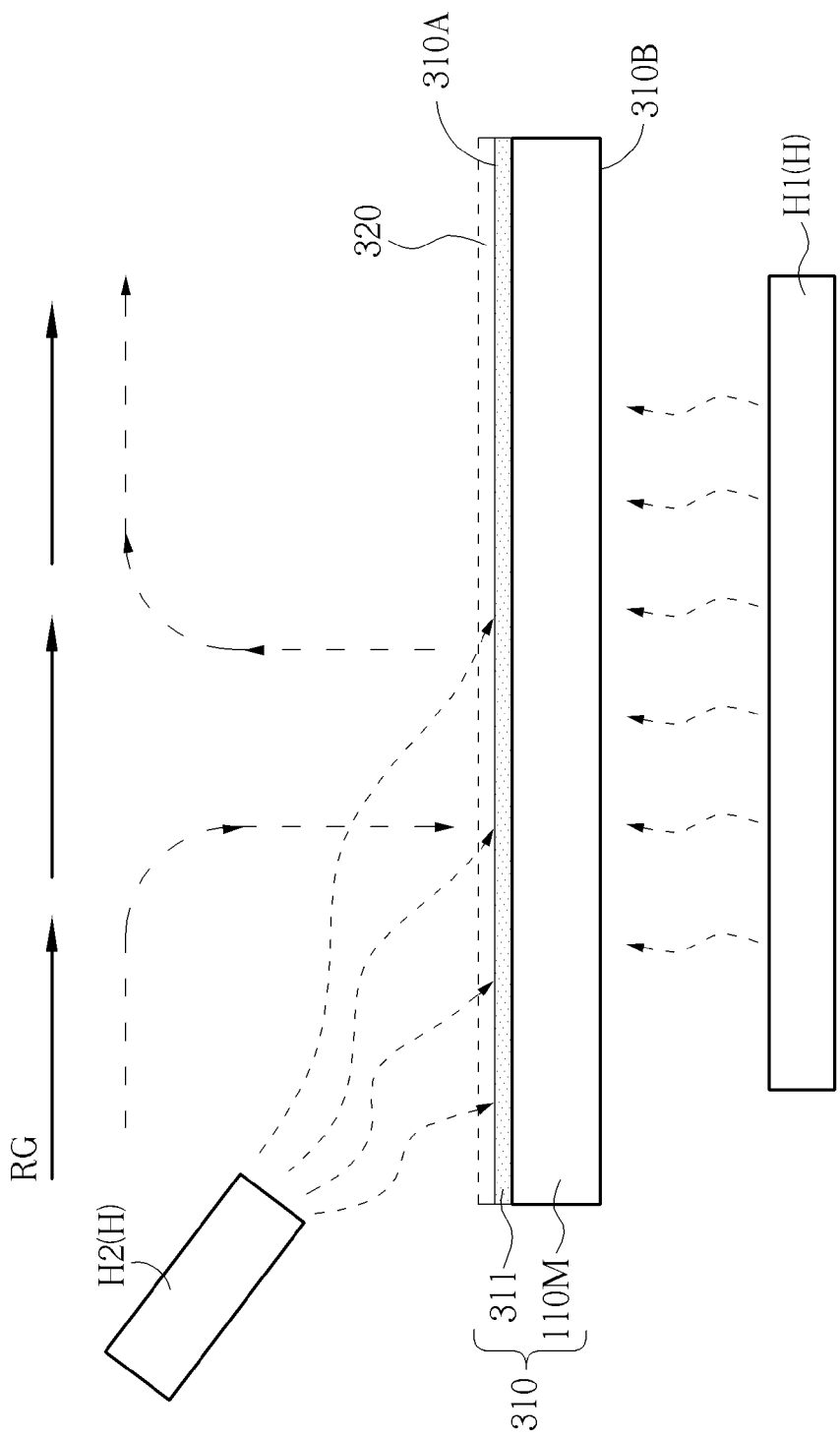
FIG. 6 is a schematic diagram illustrating a method of forming a thin film poly silicon layer according to a fifth preferred embodiment of the present invention.

Please refer to FIG. 6. FIG. 6 is a schematic diagram illustrating a method of forming a thin film poly silicon layer according to a fifth preferred embodiment of the present invention. As shown in FIG. 6, the difference between the method of forming the thin film poly silicon layer in this embodiment and the method of the first preferred embodiment is that a substrate 310 in this embodiment include the substrate base 110M and a heating auxiliary layer 311. The heating auxiliary layer 311 is disposed on the substrate basis 110M. The substrate 310 has a first surface 310A and a second surface 310B. In other words, a surface of the heating auxiliary layer 311 opposite to the substrate basis 110M may be regarded as the first surface 310A of the substrate 310. The heating auxiliary layer 311 is used to enhance heating efficiency of the heating source H2, and related process conditions may be further improved. In addition, the heating auxiliary layer 311 is made of a material with high endothermal efficiency. The heating auxiliary layer 311 may preferably include graphite, chromium oxide, or molybdenum, but not limited thereto. Because of the heating auxiliary layer 311, the first surface 310A of the substrate 310 may be heated more efficiently to the second temperature, which is high enough for directly forming a thin film poly silicon layer, by the auxiliary heating source H2, and a thin film poly silicon layer 320 may be directly formed on the first surface 310A of the substrate 310. Other crystallization processes after the silicon thin film deposition process will not be required in this embodiment.

Figure 7:
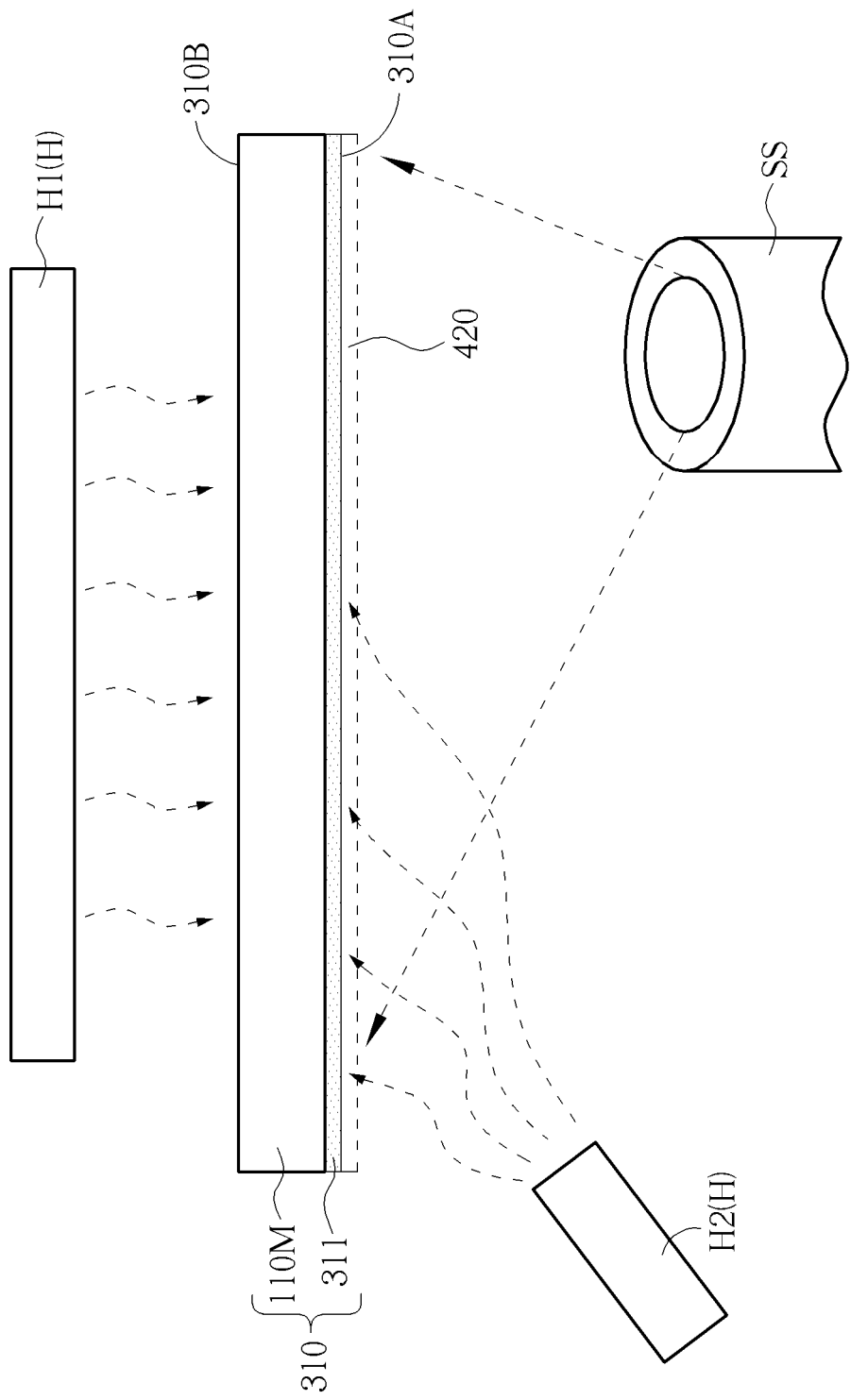
FIG. 7 is a schematic diagram illustrating a method of forming a thin film poly silicon layer according to a sixth preferred embodiment of the present invention.

Please refer to FIG. 7. FIG. 7 is a schematic diagram illustrating a method of forming a thin film poly silicon layer according to a sixth preferred embodiment of the present invention. As shown in FIG. 7, the difference between the method of forming the thin film poly silicon layer in this embodiment and the method of the fifth preferred embodiment is that the silicon thin film deposition process of this embodiment is preferably a physical vapor deposition process, and the silicon source SS such as a silicon target is employed for sputtering a silicon layer on the first surface 310A of the substrate 310. In addition, the heating auxiliary layer 311 is used in this embodiment, and the first surface 310A of the substrate 310 may be accordingly heated more efficiently to the second temperature, which is high enough for directly forming a thin film poly silicon layer, by the auxiliary heating source H2. The thin film poly silicon layer 320 may be directly formed on the first surface 310A of the substrate 310. Other crystallization processes after the silicon thin film deposition process will not be required in this embodiment.

Figure 8:
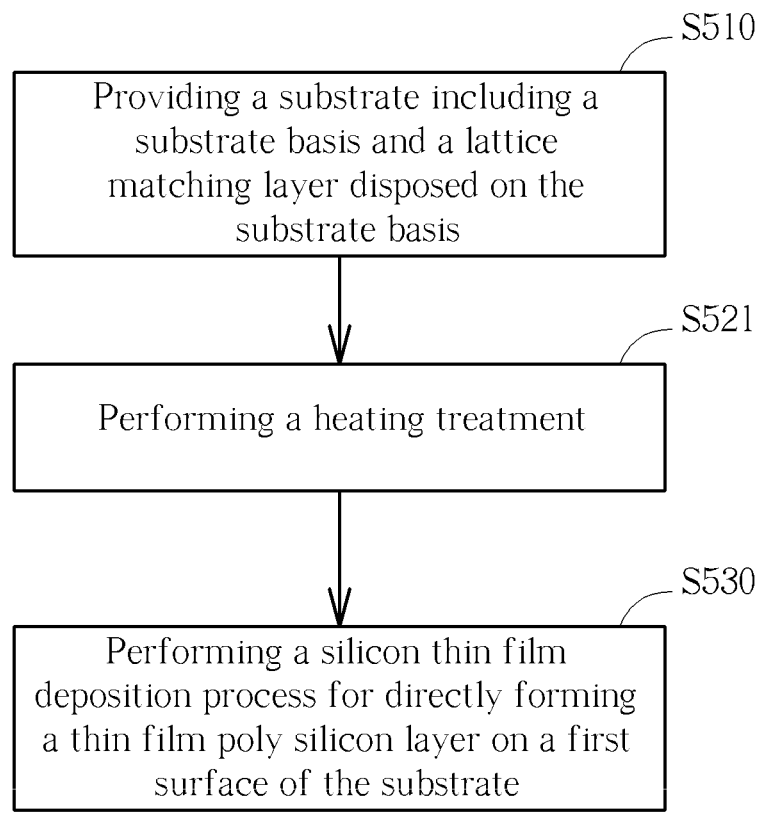
FIG. 8 is a flow chart of a method of forming a thin film poly silicon layer according to a seventh preferred embodiment of the present invention.
Figure 9:
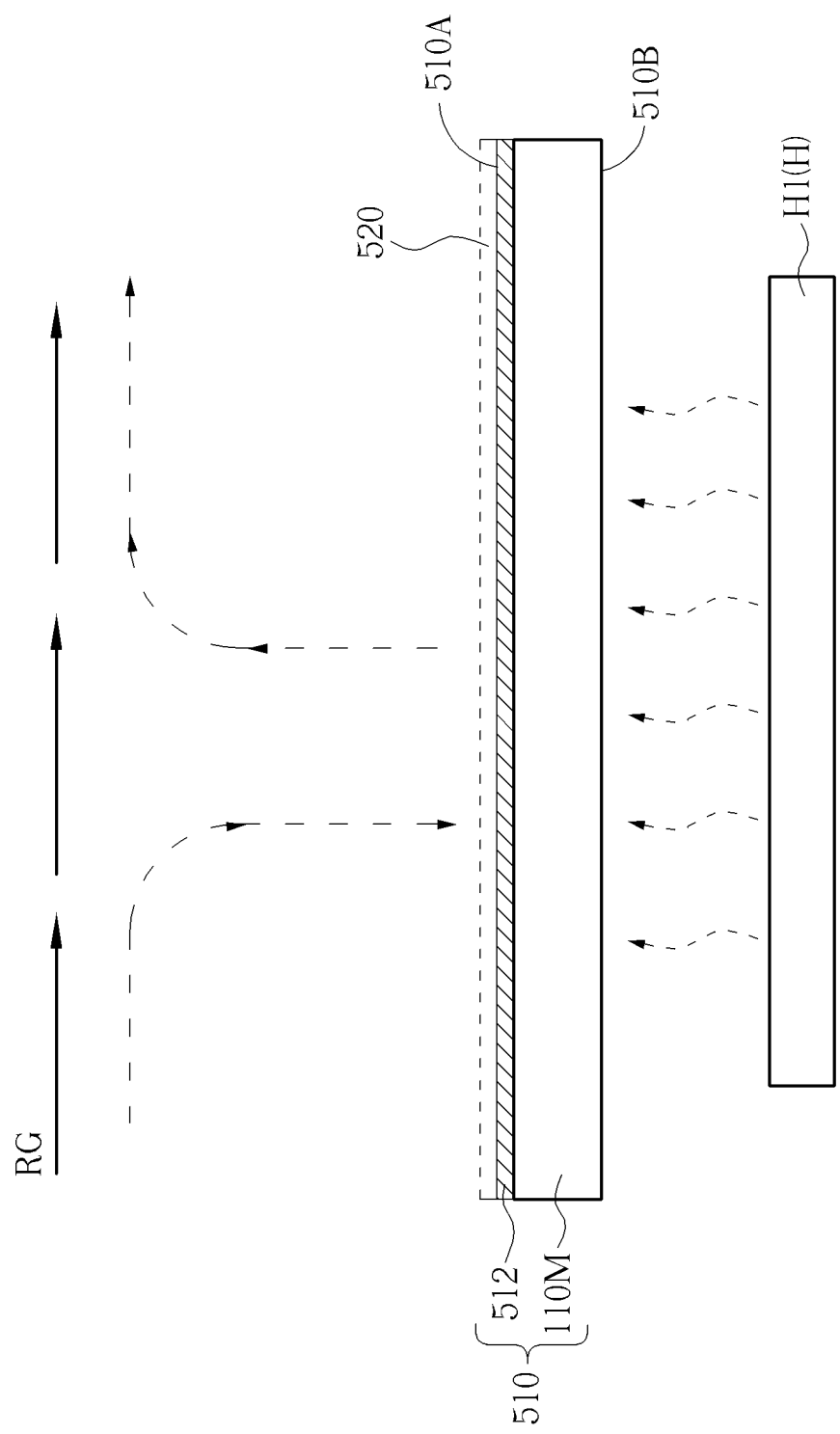
FIG. 9 is a schematic diagram illustrating the method of forming the thin film poly silicon layer according to the seventh preferred embodiment of the present invention.

Please refer to FIG. 8 and FIG. 9. FIG. 8 is a flow chart of a method of forming a thin film poly silicon layer according to a seventh preferred embodiment of the present invention, and FIG. 9 is a schematic diagram illustrating the method of this embodiment. As shown in FIG. 8 and FIG. 9, the seventh preferred embodiment of the present invention provides a method of forming a thin film poly silicon layer. The method of forming the thin film poly silicon layer includes the following steps. Firstly, in step S510, a substrate 510 is provided. The substrate 510 has a first surface 510A and a second surface 510B. In addition, the substrate 510 in this embodiment may preferably include a substrate basis 110M and a lattice matching layer 512. The lattice matching layer 512 is disposed on the substrate basis 110M. In other words, a surface of the lattice matching layer 512 opposite to the substrate basis 110M may be regarded as the first surface 510A of the substrate 510. In addition, the lattice matching layer 512 may preferably include a polymer material having a specific lattice direction, an amorphous silicon material or a metal oxide material having a specific lattice direction, such as zirconium oxide ($ZrO_2$), cerium oxide ($CeO_2$), praseodymium oxide ($PrO_2$), or yttrium oxide ($Y_2O_3$), but not limited thereto. In step S521, a heating treatment is then performed. Subsequently, in step S530, a silicon thin film deposition process is performed for directly forming a thin film poly silicon layer 520 on the first surface 510A of the substrate 510. In this embodiment, the heating treatment may preferably include heating the substrate 510 to a first temperature by the main heating source H1. It is worth noting that the first temperature may be between 150 degrees Celsius and 250 degrees Celsius because of the lattice matching layer 512 in the substrate 510, but not limited thereto. As shown in FIG. 9, the silicon thin film deposition process of this embodiment is preferably a chemical vapor deposition process, such as a plasma enhanced chemical vapor deposition process, a metal-organic chemical vapor deposition process, or a low pressure chemical vapor deposition process, but not limited thereto.

Figure 10:
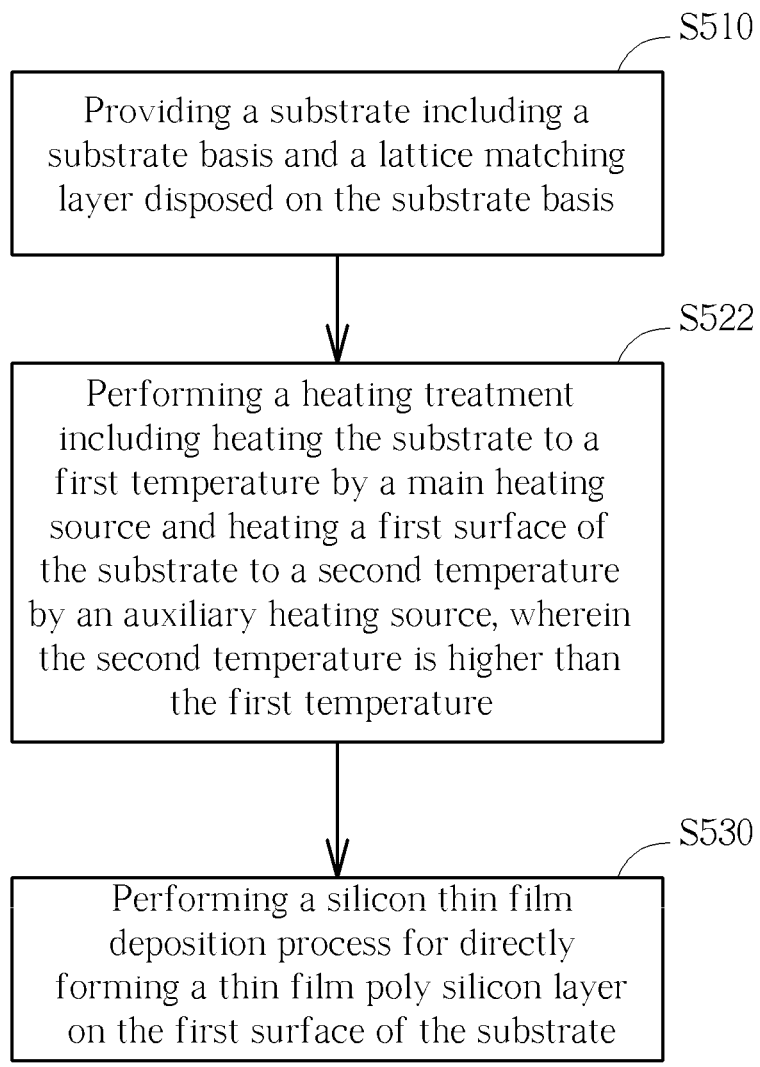
FIG. 10 is a flow chart of a method of forming a thin film poly silicon layer according to an eighth preferred embodiment of the present invention.
Figure 11:
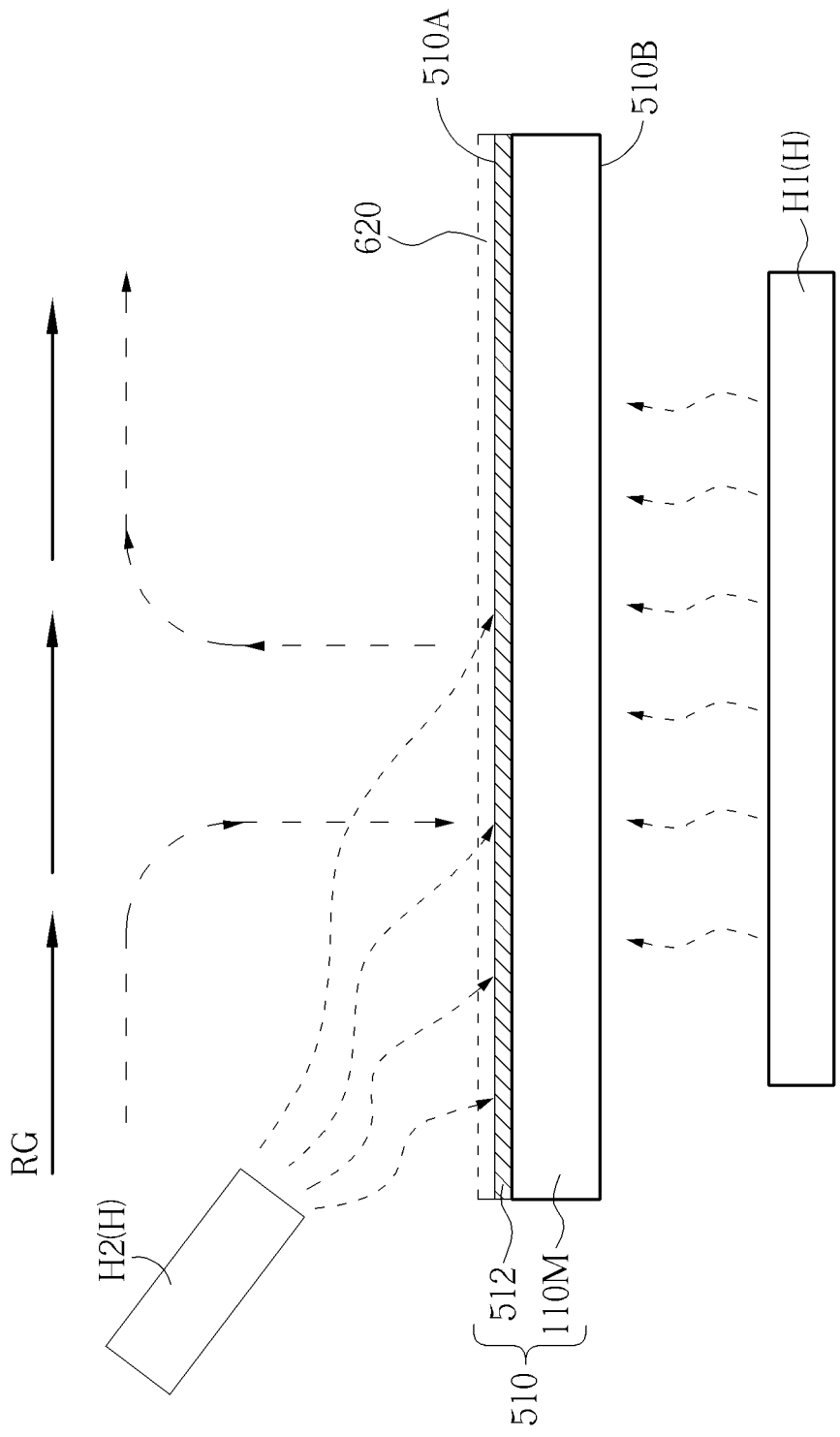
FIG. 11 is a schematic diagram illustrating the method of forming the thin film poly silicon layer according to the eighth preferred embodiment of the present invention.

Please refer to FIG. 10 and FIG. 11. FIG. 10 is a flow chart of a method of forming a thin film poly silicon layer according to an eighth preferred embodiment of the present invention, and FIG. 11 is a schematic diagram illustrating the method of this embodiment. As shown in FIG. 10 and FIG. 11, the difference between the method of forming the thin film poly silicon layer in this embodiment and the method of the seventh preferred embodiment is that a heating treatment is performed in step S522 after the step S510 in this embodiment. The heating treatment mentioned above includes heating the substrate 510 to a temperature higher than 250 degrees Celsius by a heating source H. In this embodiment, the heating source H may preferably include a main heating source H1 and an auxiliary heating source H2. The heating treatment may preferably include heating the substrate 510 to a first temperature by the main heating source H1, and heating the first surface 510A of the substrate 510 to a second temperature by the auxiliary heating source H2, but not limited thereto. Additionally, the second temperature is preferably higher than the first temperature. For example, the first temperature is preferably higher than 150 degrees Celsius, and the second temperature is preferably higher than 250 degrees Celsius, but not limited thereto. Subsequently, in step S530, a silicon thin film deposition process is then performed for directly forming a thin film poly silicon layer 620 on the first surface 510A of the substrate 510.

Apart from heating the first surface 510A of the substrate 510 by the auxiliary heating source H2 in this embodiment, the other components, allocations, material properties, and the silicon thin film deposition process in this embodiment are similar to those of the method of forming the thin film poly silicon layer in the seventh preferred embodiment detailed above and will not be redundantly described. It is worth noting that, apart from heating the first surface 510A of the substrate 510 to the second temperature by the auxiliary heating source H2 before the silicon thin film deposition process in the method of forming the thin film poly silicon layer of this embodiment, the auxiliary heating source H2 may also be selectively employed to continuously heat the first surface 510A, the lattice matching layer 512, and the deposited thin film silicon layer in an initial stage or other periods of the silicon thin film deposition process so as to further improve the crystallization quality of the thin film poly silicon layer 620. In addition, the auxiliary heating source H2 in this embodiment may preferably include a high energy heating source such as a light heating source, an ion beam heating source, an electrode beam heating source, a furnace tube heating source or a filament heating source, and the main heating source H1 in this embodiment may preferably include a susceptor heating source, a radio frequency heating source, or a infrared heating source, but the present invention is not limited to this. Other appropriate heating sources may also be selectively employed as the main heating source H1 and the auxiliary heating source H2 for different heating considerations. In this embodiment, the heating temperature of the first surface 510A may be further lowered because of the lattice matching layer 512 in the substrate 510. The heat-resistant property of the substrate 510 in this embodiment may not be strictly requested accordingly.

Figure 12:
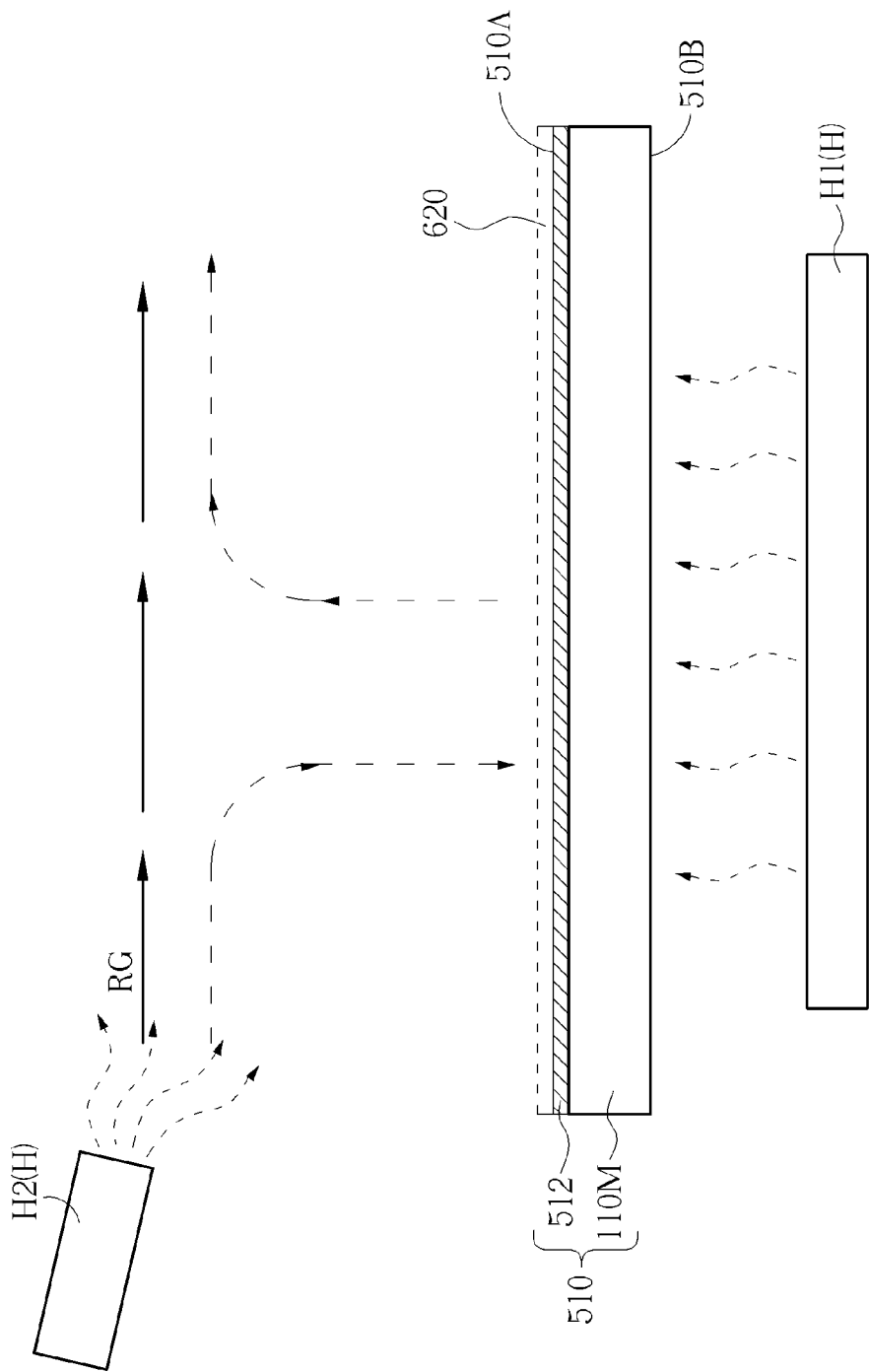
FIG. 12 is a schematic diagram illustrating a method of forming a thin film poly silicon layer according to a ninth preferred embodiment of the present invention.

Please refer to FIG. 12. FIG. 12 is a schematic diagram illustrating a method of forming a thin film poly silicon layer according to a ninth preferred embodiment of the present invention. As shown in FIG. 12, in this embodiment, the silicon thin film deposition process of this embodiment may preferably include using a reactive gaseous material RG to form the thin film poly silicon layer 620 on the first surface 510A of the substrate 510. The reactive gaseous material RG may preferably include silane or dichlorosilane, but not limited thereto. The difference between the method of forming the thin film poly silicon layer in this embodiment and the method of the eighth preferred embodiment is that the heating treatment in this embodiment may preferably include heating the substrate 510 to a first temperature by the main heating source H1, and heating the reactive gaseous material RG to a second temperature by the auxiliary heating source H2. The second temperature is preferably higher than the first temperature. For instance, the first temperature is preferably higher than 150 degrees Celsius, and the second temperature is preferably higher than 250 degrees Celsius, but not limited thereto. Because of the lattice matching layer 512 in the substrate 510, the reactive gaseous material RG may be heated to a relatively low temperature for directly forming the thin film poly silicon layer 620 on the first surface 510A of the substrate 510. Additionally, the auxiliary heating source H2 in this embodiment may preferably include a high energy heating source such as a light heating source, an ion beam heating source, an electrode beam heating source, a furnace tube heating source or a filament heating source, but not limited thereto. Apart from the heating treatment in this embodiment, the other components and material properties in this embodiment are similar to those of the method of forming the thin film poly silicon layer in the eighth preferred embodiment detailed above and will not be redundantly described. It is worth noting that, in other preferred embodiments of the present invention, the auxiliary heating source H2 may also be employed to heat both the first surface 510A of the substrate 110 and the reactive gaseous material RG to the second temperature so as to further enhance the crystallization quality of the thin film poly silicon layer 620.

Figure 13:
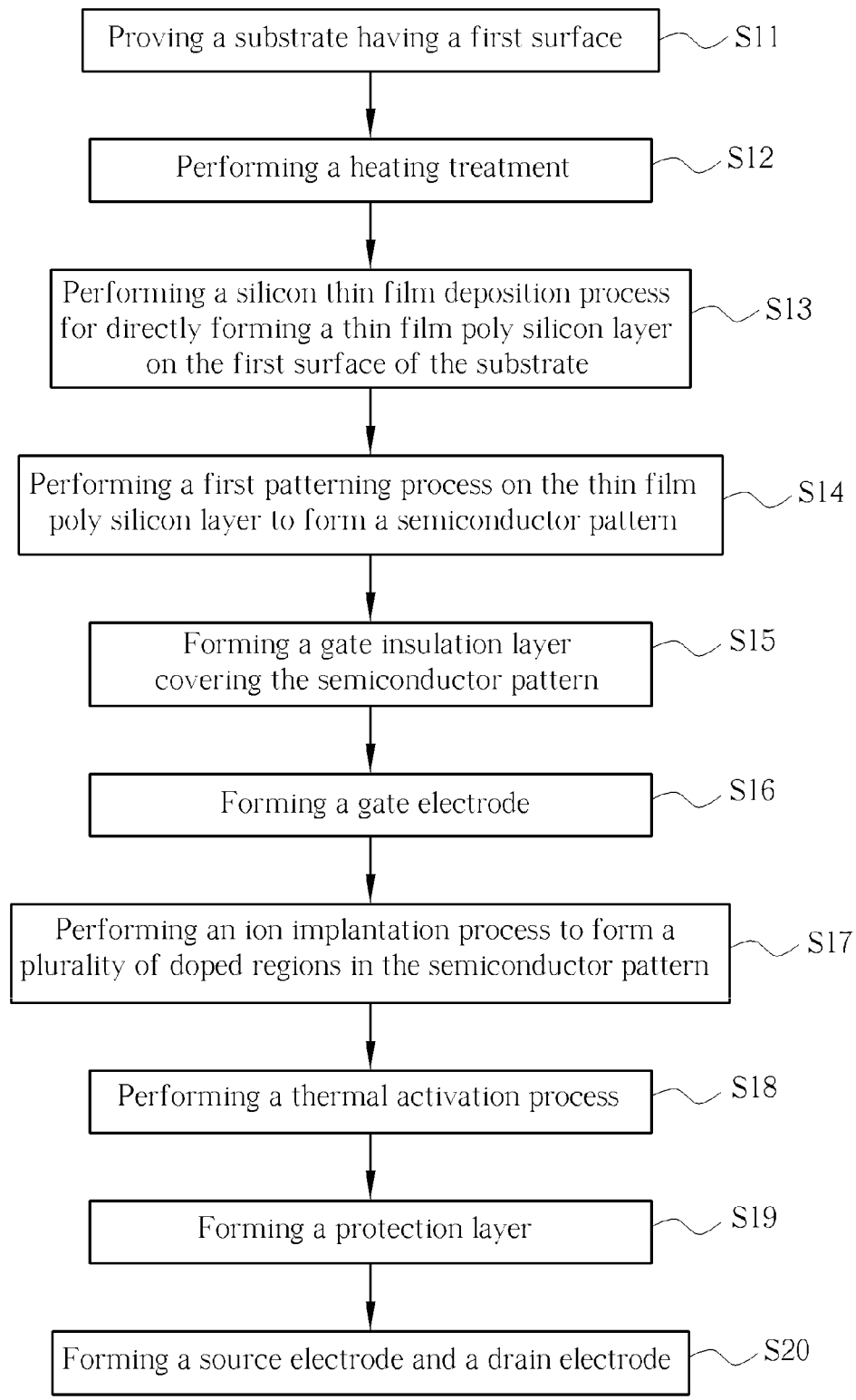
FIG. 13 is a flow chart of a method of forming a thin film transistor according to a tenth preferred embodiment of the present invention.
Figure 14:
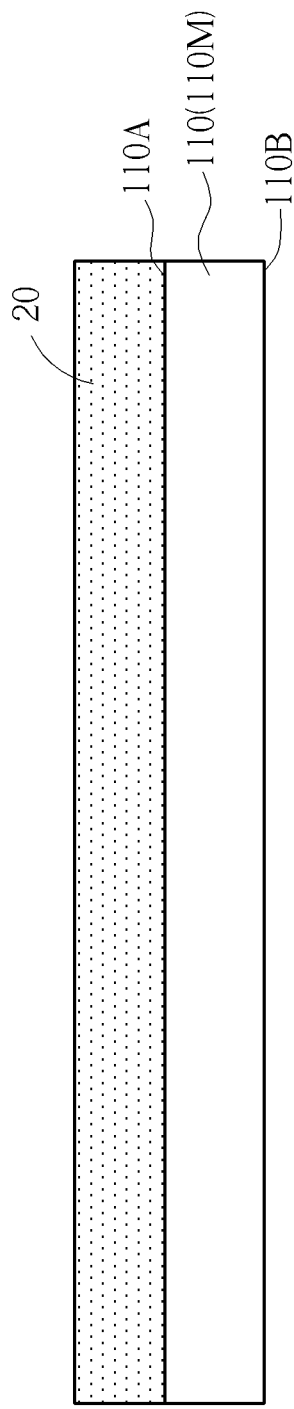
FIGS. 14-16 are schematic diagrams illustrating the method of forming the thin film transistor according to the tenth preferred embodiment of the present invention.
Figure 15:
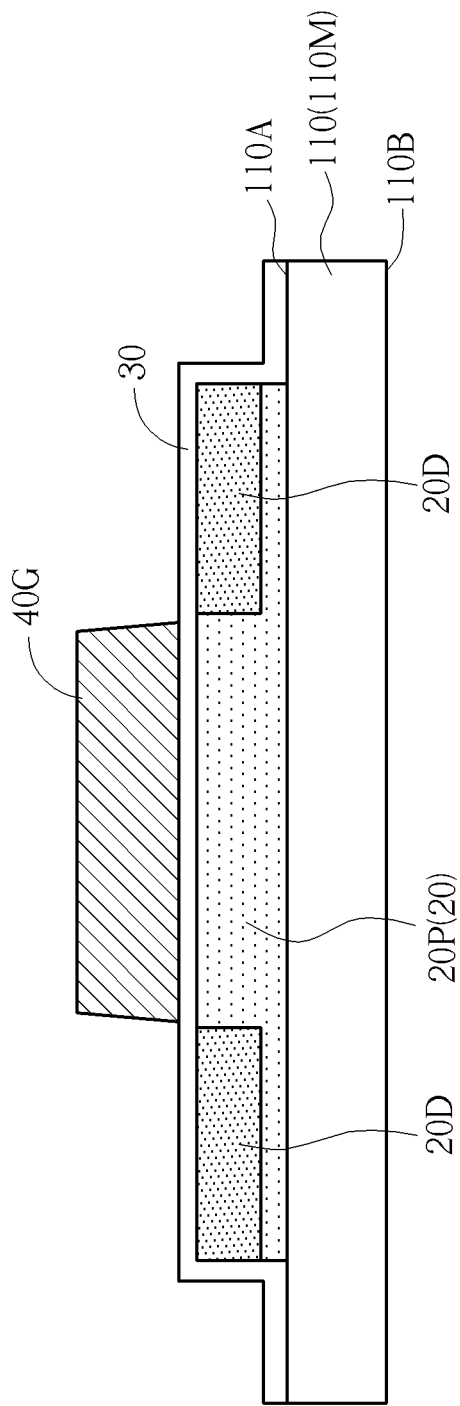
Figure 16:
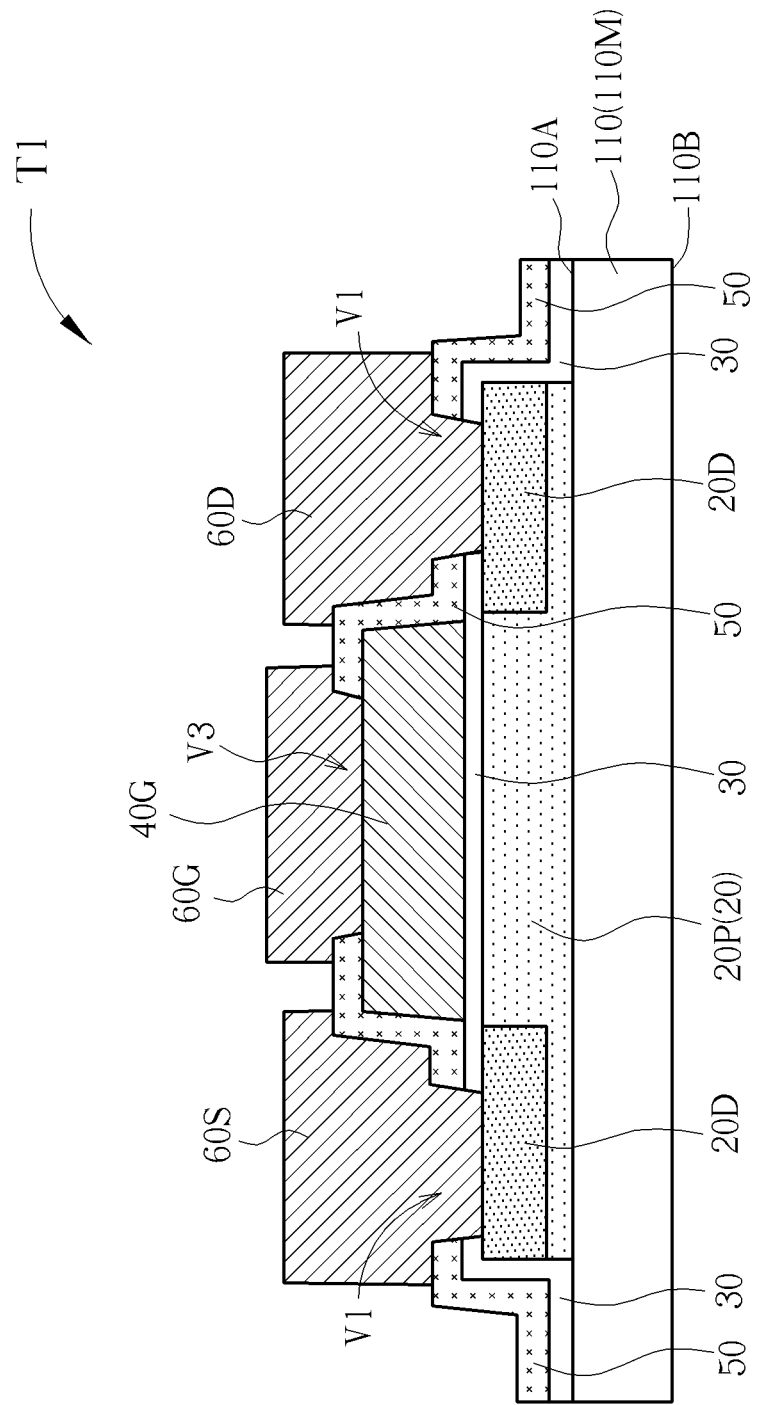

Please refer to FIGS. 13-16. FIG. 13 is a flow chart of a method of forming a thin film transistor according to a tenth preferred embodiment of the present invention. FIGS. 14-16 are schematic diagrams illustrating the method of forming the thin film transistor in this embodiment. As shown in FIGS. 13-16, this embodiment provides a method of forming a thin film transistor. The method of forming the thin film transistor includes the following steps. Firstly, in step S11, a substrate 110 is provided. The substrate 110 has a first surface 110A and a second surface 110B. Additionally, the substrate 110 in this embodiment may preferably include a substrate basis 110M. Subsequently, in step S12, a heating treatment is performed. In step S130, a silicon thin film deposition process is then performed for directly forming a thin film poly silicon layer 20 on the first surface 110A of the substrate 110. It is worth noting that the forming method of the thin film poly silicon layer 20 may be chosen from the methods of forming the thin film poly silicon layer in the first to ninth preferred embodiments of the present invention described above. In other words, in the forming method of the thin film poly silicon layer 20 of this embodiment, the heating approach, the heating temperature range, the silicon thin film deposition process, the process conditions and the material properties in this embodiment are similar to those of the methods of forming the thin film poly silicon layer in the first to ninth preferred embodiments detailed above and will not be redundantly described. Additionally, in the step of forming the thin film poly silicon layer 20, a heating auxiliary layer (not shown) or/and a lattice matching layer (not shown) may be selectively applied as the embodiments described above, but not limited thereto.

As shown in FIG. 13 and FIG. 15, in step S14, a first patterning process is then performed on the thin film poly silicon layer 20 so as to form a semiconductor pattern 20P. Subsequently, in step S15, a gate insulation layer 30 is formed to cover the semiconductor pattern 20P and the substrate 110. In step S16, a gate electrode 40G is then formed on the gate insulation layer 30. In other words, the gate insulation layer 30 in this embodiment is formed after the first patterning process, and the gate electrode 40G is formed after the gate insulation layer 30 is formed. Subsequently, in step S17, an ion implantation process is then performed after the gate electrode 40G is formed so as to form a plurality of doped regions 20D in the semiconductor pattern 20P. It is worth noting that the doped regions 20D in this embodiment are preferably p-type doped poly silicon materials, but not limited thereto. Additionally, the gate electrode 40G may preferably be used as a shadow mask in the ion implantation process mentioned above so as to simplify the related processes and generate a self-aligned effect, but not limited thereto. In this embodiment, the method of forming the thin film transistor may further include performing a thermal activation process in step S18 after the ion implantation process in the step S17, and the thermal activation process is configured to activate the doped regions 20D. The thermal activation process may preferably include a light heating approach, an ion beam heating approach, an electrode beam heating approach, a furnace tube heating approach or a filament heating approach, but not limited thereto. Subsequently, as shown in FIG. 13 and FIG. 16, in step S19, a protection layer 50 is formed on the gate insulation layer 30 and the gate electrode 40G. A plurality of first openings V1 are then formed in the protection layer 50 and the gate insulation layer 30. The first openings V1 partially expose the doped regions 20D. A source electrode 60S and a drain electrode 60D are then formed in step S20 so as to form a thin film transistor T1 in FIG. 16. In this embodiment, the source electrode 60S and the drain electrode 60D contact the doped region 20D for being electrically connected with the doped region 20D via the first openings V1. A third opening V3 may be formed in the protection layer 50 when forming the first openings V1. The third opening V3 at least partially exposes the gate electrode 40G, but not limited thereto. Additionally, in the method of forming the thin film transistor in this embodiment, an auxiliary electrode 60G may be selectively formed in the step of forming the source electrode 60S and the drain electrode 60D. The auxiliary electrode 60G may contact and be electrically connected with the gate electrode 40G via the third opening V3. In other words, the source electrode 60S, the drain electrode 60D, and the auxiliary electrode 60G may be formed simultaneously by patterning a conductive layer, but not limited thereto. In this embodiment, the thin film transistor T1 may be regarded as a top gate poly silicon thin film transistor.

Figure 17:
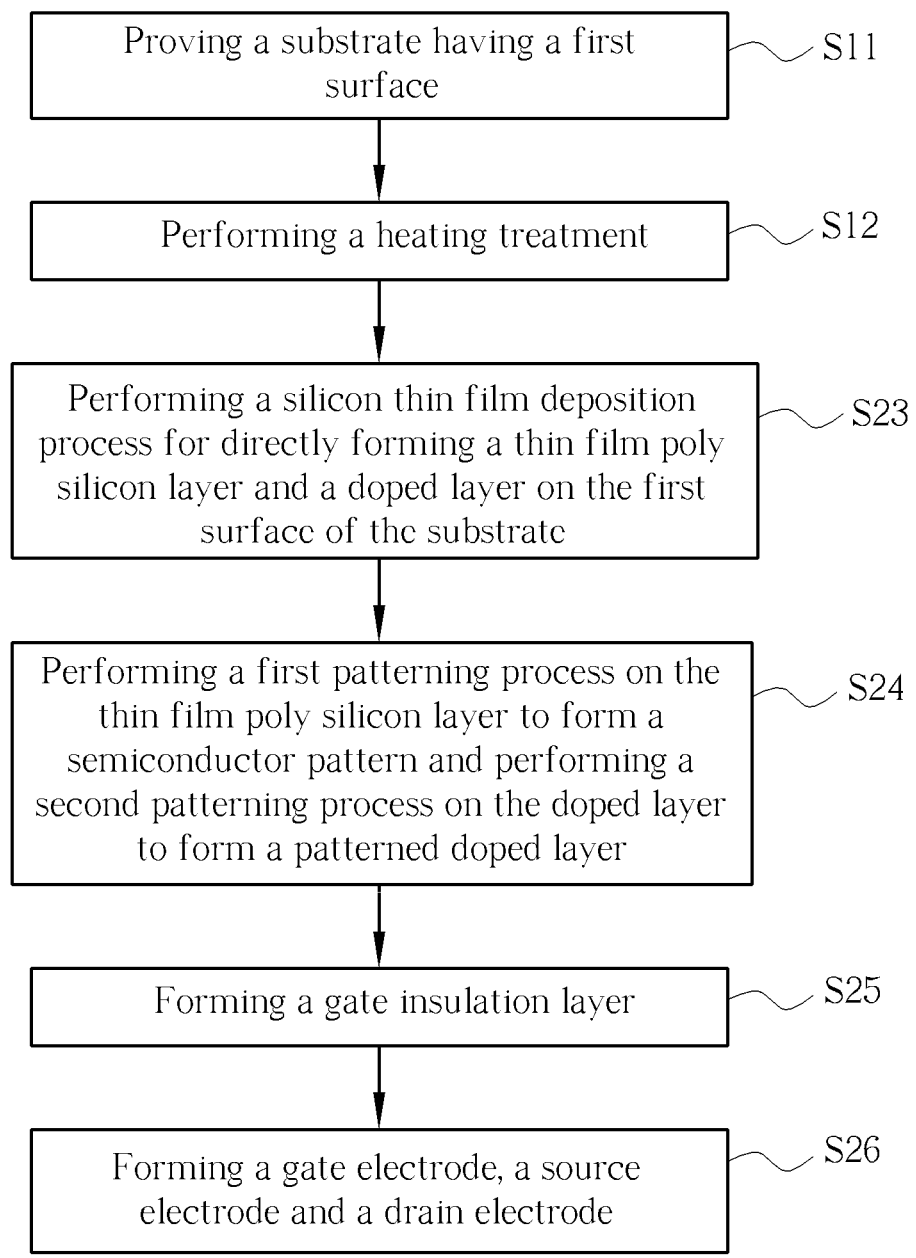
FIG. 17 is a flow chart of a method of forming a thin film transistor according to an eleventh preferred embodiment of the present invention.
Figure 18:
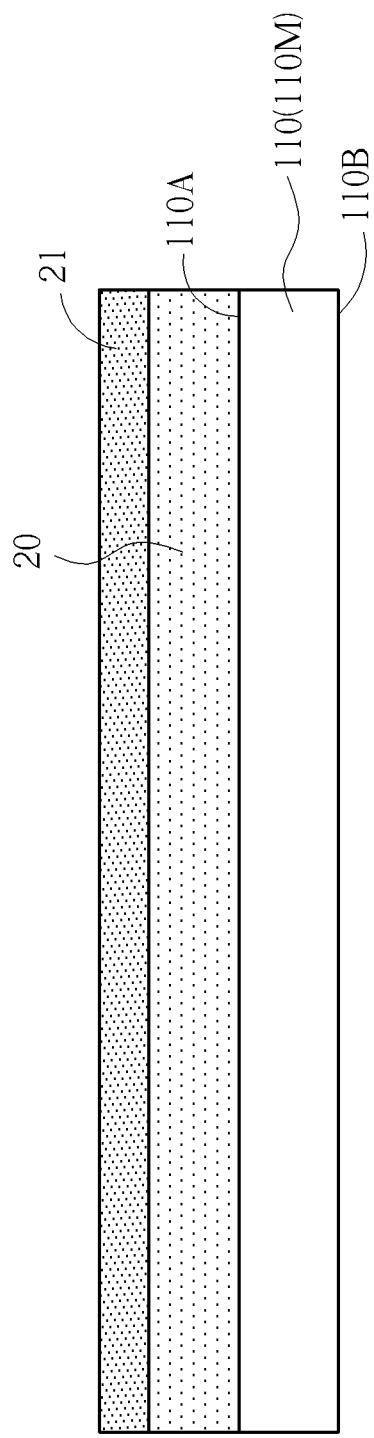
FIGS. 18-20 are schematic diagrams illustrating the method of forming the thin film transistor according to the eleventh preferred embodiment of the present invention.
Figure 19:
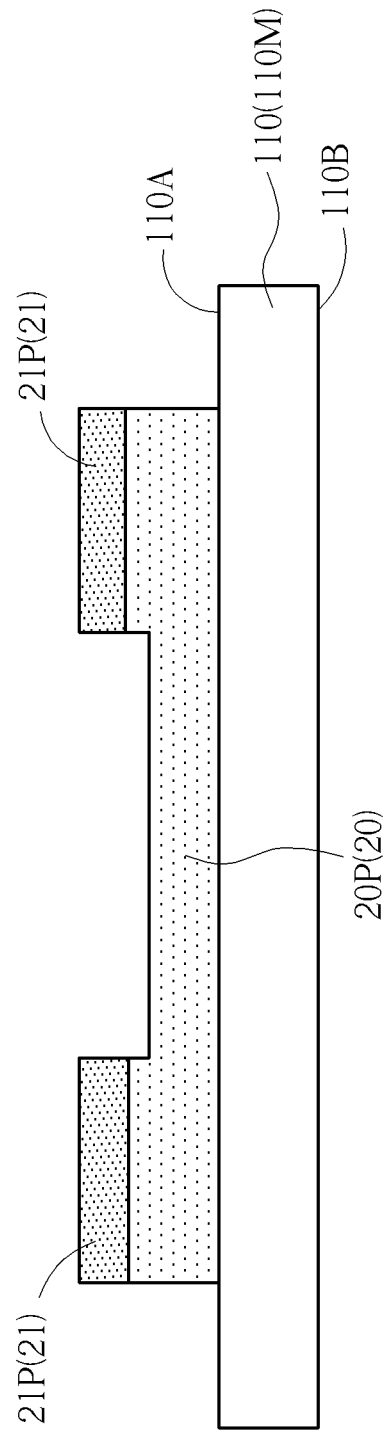
Figure 20:
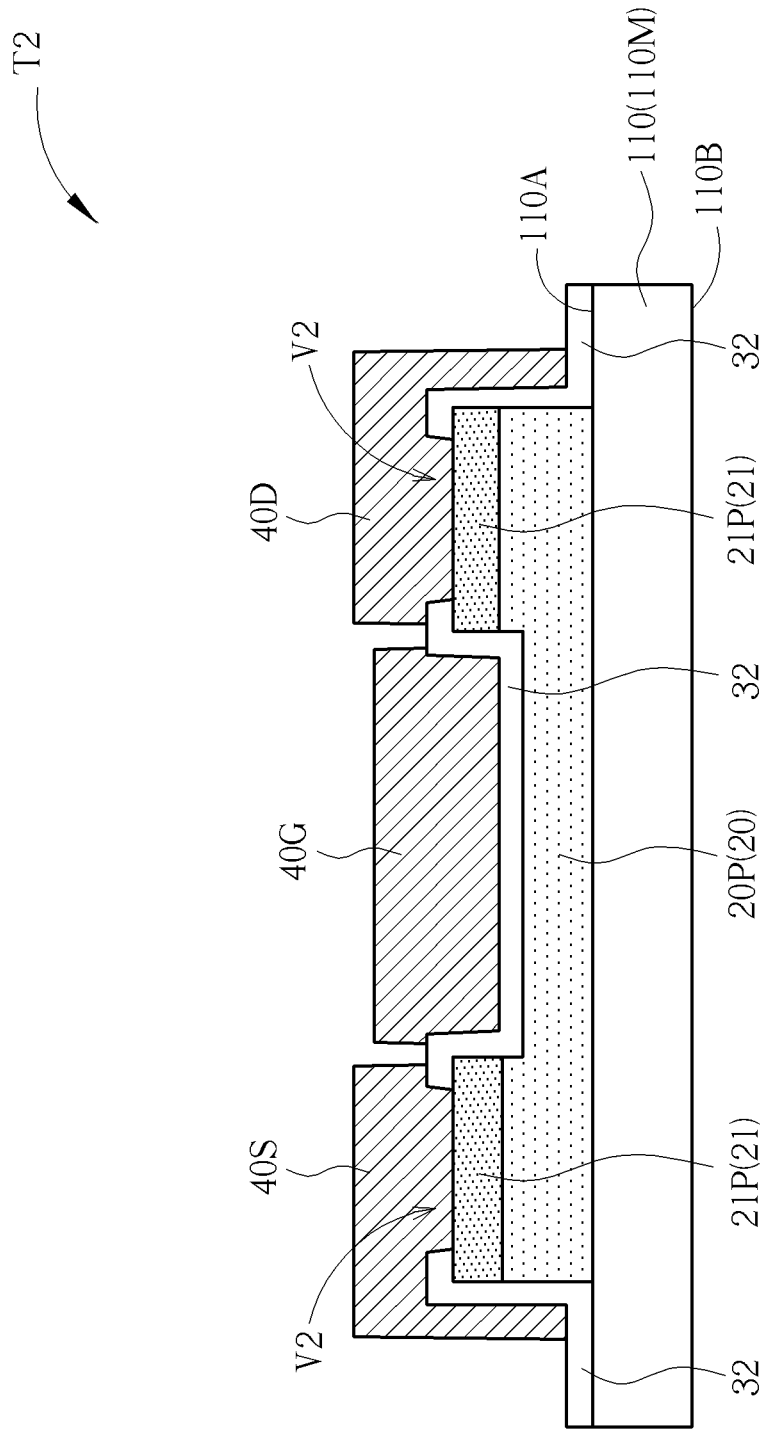

Please refer to FIGS. 17-20. FIG. 17 is a flow chart of a method of forming a thin film transistor according to an eleventh preferred embodiment of the present invention. FIGS. 18-20 are schematic diagrams illustrating the method of forming the thin film transistor in this embodiment. As shown in FIGS. 17-20, the difference between the method of forming the thin film transistor in this embodiment and the method of the tenth preferred embodiment is that the thin film poly silicon layer 20 and a doped layer 21 are directly formed on the first surface 110A of the substrate 110 in step S23 after the step S12. The dope layer 21 is formed on the thin film poly silicon layer 20. It is worth noting that the doped layer 21 and the thin film poly silicon layer 20 are preferably formed in one identical silicon thin film deposition process so as to simplify the related processes, but not limited thereto. The doped layer 21 in this embodiment may preferably include a p-type doped poly silicon material, but not limited thereto. Subsequently, as shown in FIG. 17 and FIG. 19, in step S24, a first patterning process is then performed on the thin film poly silicon layer 20 to form a semiconductor pattern 20P, and a second patterning process is performed on the doped layer 21 to form a patterned doped layer 21P. In this embodiment, the first patterning process and the second patterning process are preferably integrated in one photo lithography etching process for process simplification purpose, but not limited thereto. In other preferred embodiments of the present invention, the first patterning process and the second patterning process may also be performed separately according to other considerations.

As shown in FIG. 17 and FIG. 20, in step S25, a gate insulation layer 32 is formed after the second patterning process, and the gate insulation layer 32 covers the semiconductor pattern 20P and the patterned doped layer 21P. The gate insulation layer 32 may preferably include a plurality of second openings V2, and the second openings V2 are used to at least partially expose the patterned doped layer 21P. Subsequently, in step S26, a thin film transistor T2 as shown in FIG. 20 is then formed after forming a gate electrode 40G, a source electrode 40S, and a drain electrode 40D. In other words, the gate electrode 40G, the source electrode 40S, and the drain electrode 40D are formed after the gate insulation layer 32 is formed. The gate electrode 40G, the source electrode 40S, and the drain electrode 40D are preferably formed by one identical process step so as to simplify the process. For example, the gate electrode 40G, the source electrode 40S and the drain electrode 40D may be simultaneously formed by patterning one conductive layer, but not limited thereto. Because the doped layer 21 and the thin film poly silicon layer 20 may be formed by one identical process, an additional ion implantation process will not be required in this embodiment. The purposes of process simplification and manufacturing cost reduction may be achieved accordingly.

Figure 21:
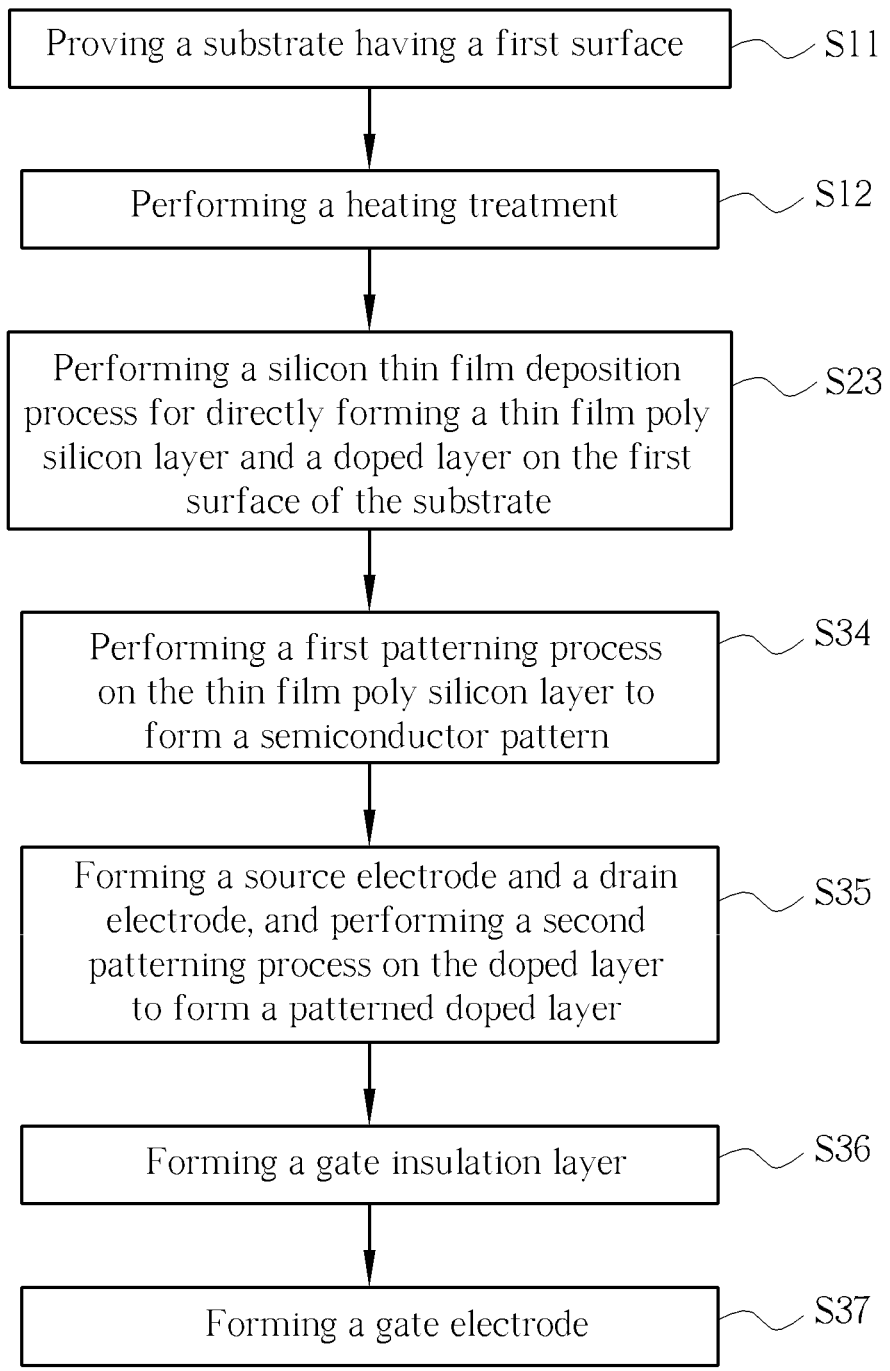
FIG. 21 is a flow chart of a method of forming a thin film transistor according to a twelfth preferred embodiment of the present invention.
Figure 22:
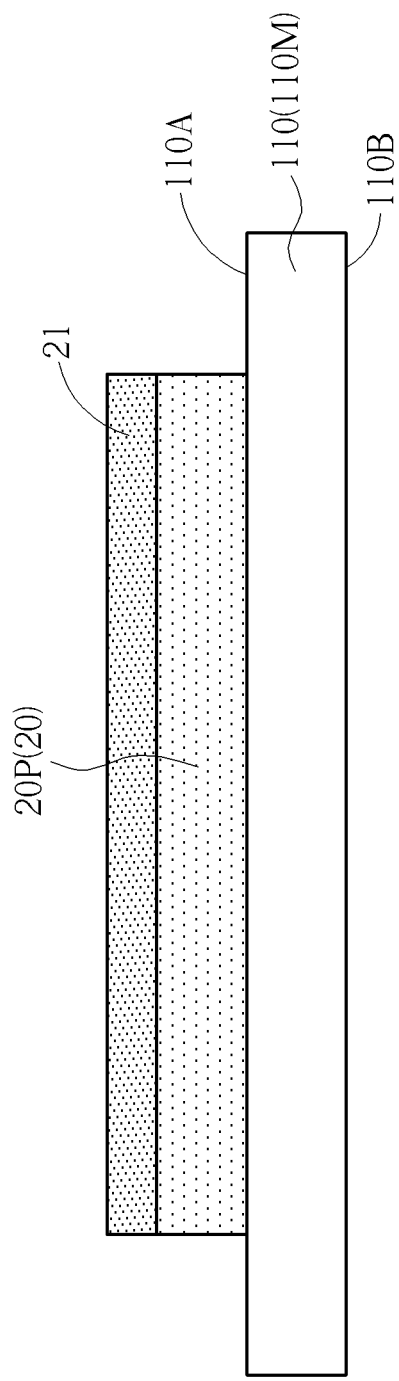
FIG. 22 and FIG. 23 are schematic diagrams illustrating the method of forming the thin film transistor according to the twelfth preferred embodiment of the present invention.
Figure 23:
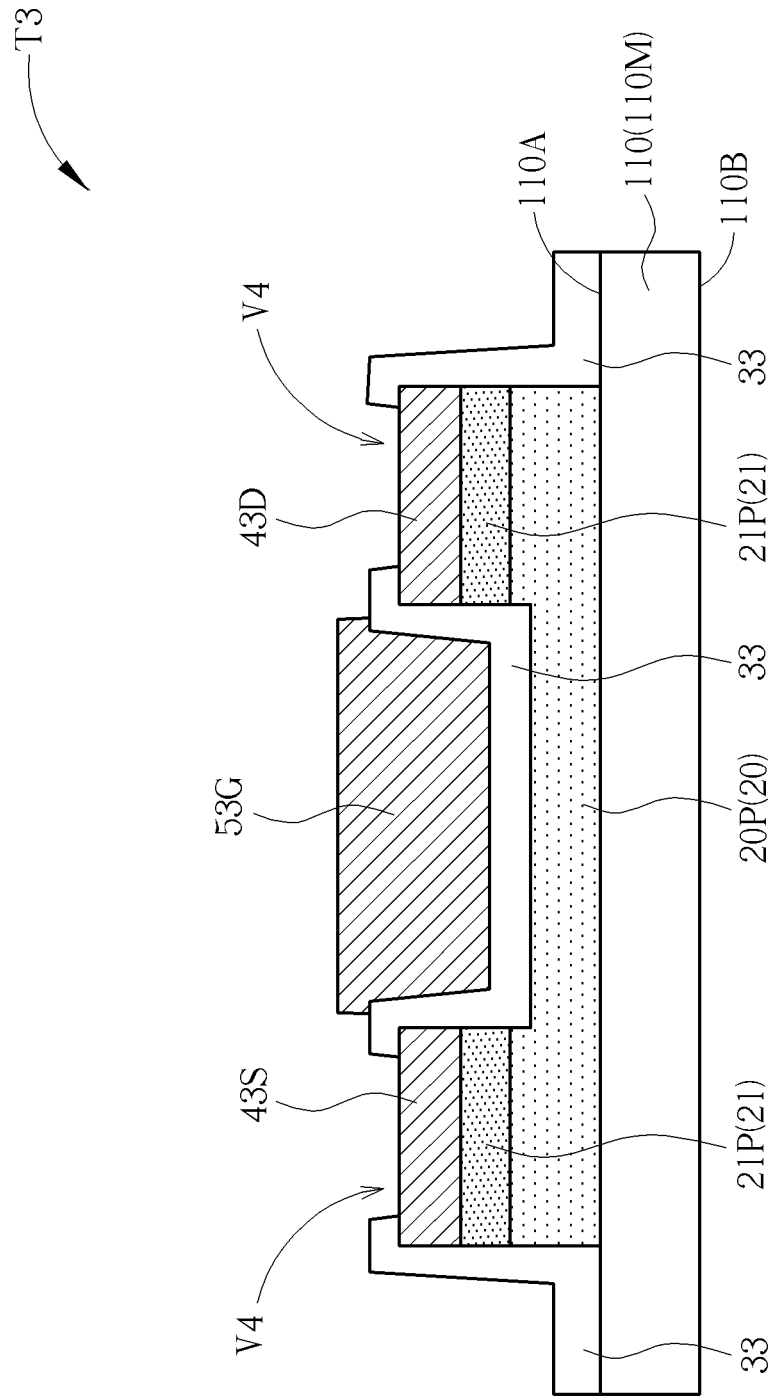

Please refer to FIGS. 21-23. FIG. 21 is a flow chart of a method of forming a thin film transistor according to a twelfth preferred embodiment of the present invention. FIG. 22 and FIG. 23 are schematic diagrams illustrating the method of forming the thin film transistor in this embodiment. As shown in FIGS. 21-23, the difference between the method of forming the thin film transistor in this embodiment and the method of the eleventh preferred embodiment is that a first patterning process is performed on a thin film poly silicon layer 20 to form a semiconductor pattern 20P in step S34 after the step S23. Subsequently, in step S35, a source electrode 43S and a drain electrode 43D are formed on the doped layer 21, and a second patterning process is then performed on the doped layer 21 to form a patterned doped layer 21P. In this embodiment, the second patterning process and the process of forming the source electrode 43S and the drain electrode 43D are preferably integrated in one photo lithography etching process for process simplification purpose, but not limited thereto. In other words, the patterned doped layer 21P, the source electrode 43S, and the drain electrode 43D are preferably formed by an identical process step. In other preferred embodiments of the present invention, the second patterning process may also be performed after the source electrode 43S and the drain electrode 43D are formed according to other considerations. The source electrode 43S and the drain electrode 43D may preferably be used as a shadow mask in the second patterning process mentioned above so as to simplify the related processes, but not limited thereto. Subsequently, as shown in FIG. 21 and FIG. 23, in step S36, a gate insulation layer 33 is formed after the second patterning process. The gate insulation layer 33 covers the source electrode 43S, the drain electrode 43D, the patterned doped layer 21P and the semiconductor pattern 20P. The gate insulation layer 33 includes a plurality of second openings V4, and the second openings V4 are used to at least partially expose the source electrode 43S and the drain electrode 43D. In step S37, a thin film transistor T3 as shown in FIG. 23 is formed after a gate electrode 53G is formed on the gate insulation layer 33.

Figure 24:
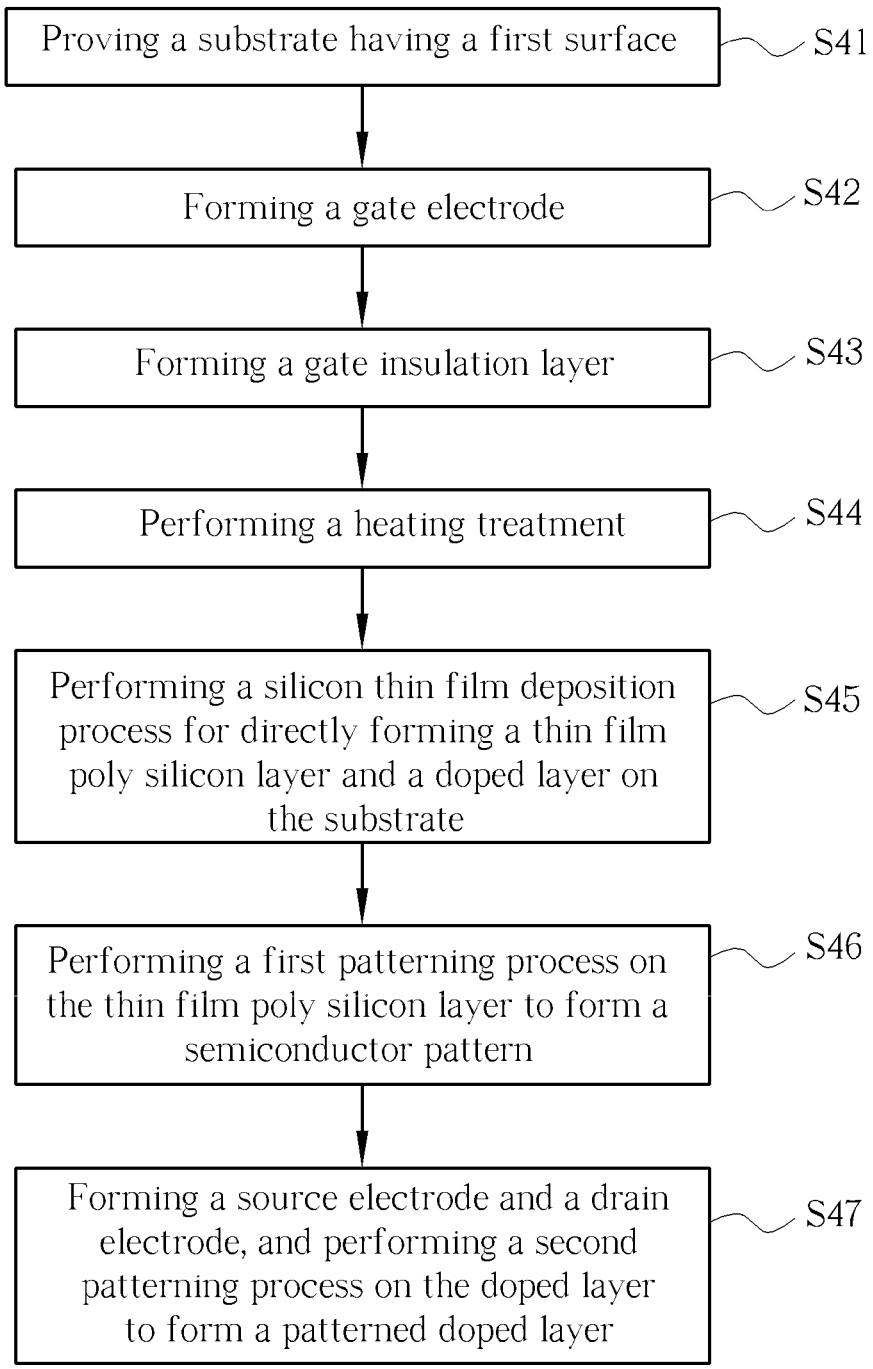
FIG. 24 is a flow chart of a method of forming a thin film transistor according to a thirteenth preferred embodiment of the present invention.
Figure 25:
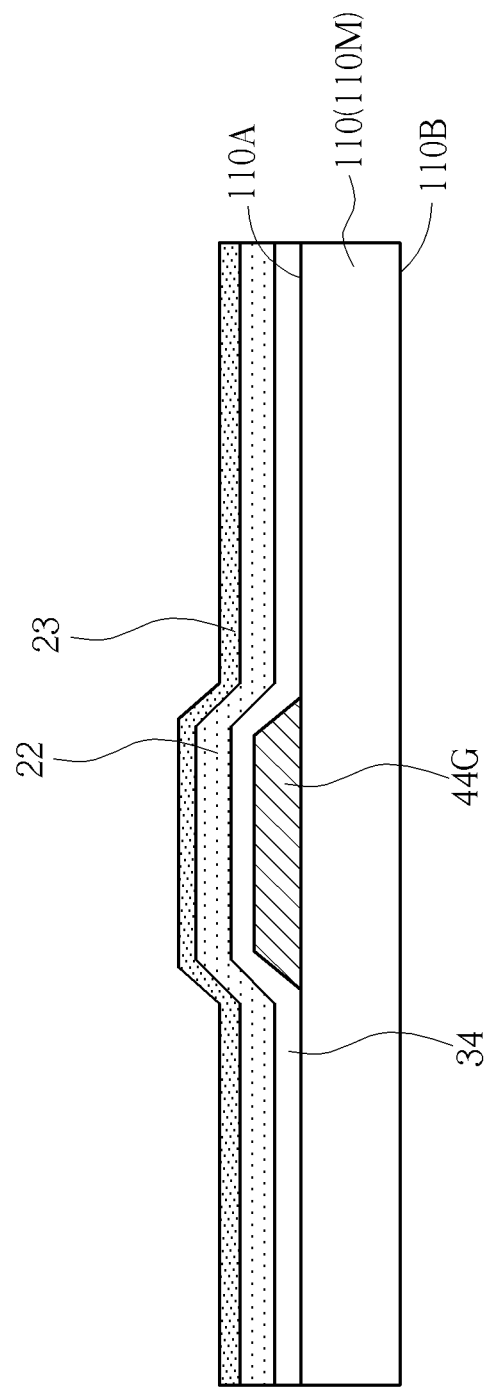
FIG. 25 and FIG. 26 are schematic diagrams illustrating the method of forming the thin film transistor according to the thirteenth preferred embodiment of the present invention.
Figure 26:
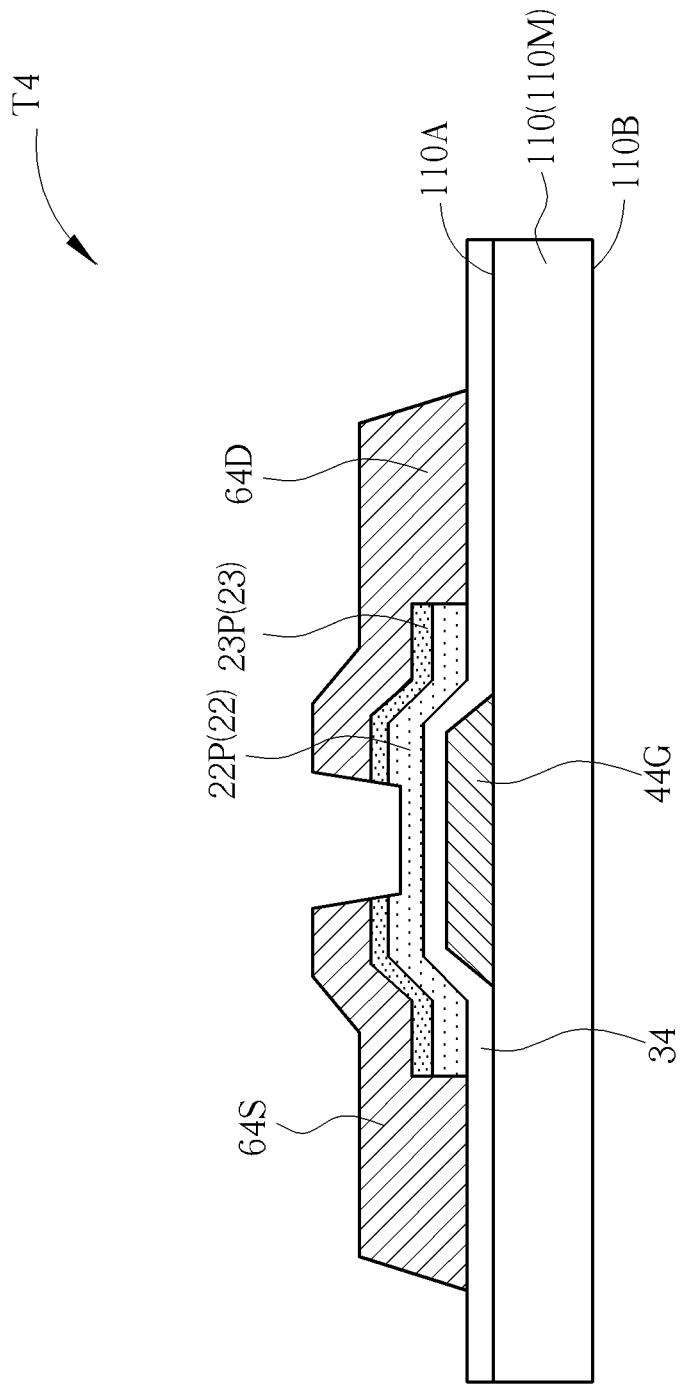

Please refer to FIGS. 24-26. FIG. 24 is a flow chart of a method of forming a thin film transistor according to a thirteenth preferred embodiment of the present invention. FIG. 25 and FIG. 26 are schematic diagrams illustrating the method of forming the thin film transistor in this embodiment. As shown in FIGS. 24-26, the method of forming the thin film transistor in this embodiment includes the following steps. Firstly, in step S41, a substrate 110 is provided. The substrate 110 has a first surface 110A and a second surface 110B. Subsequently, in step S42, a gate electrode 44G is formed on the substrate 110. A gate insulation layer 34 is then formed in step S43, and the gate insulation layer 34 covers the gate electrode 44G and the substrate 110. In step S44, a heating treatment is performed. In step S45, a silicon thin film deposition process is then performed for directly forming a thin film poly silicon layer 22 and a doped layer 23 on the substrate 110. It is worth noting that the forming method of the thin film poly silicon layer 22 may be chosen from the methods of forming the thin film poly silicon layer in the first to the ninth preferred embodiments of the present invention described above. In other words, in the forming method of the thin film poly silicon layer 22 of this embodiment, the heating approach, the heating temperature range, the silicon thin film deposition process, the process conditions and the material properties in this embodiment are similar to those of the methods of forming the thin film poly silicon layer in the first to ninth preferred embodiments detailed above and will not be redundantly described. Additionally, in the step of forming the thin film poly silicon layer 22, a heating auxiliary layer (not shown) or/and a lattice matching layer (not shown) may be selectively applied as the embodiments described above, but not limited thereto. In addition, the doped layer 23 in this embodiment is preferably p-type doped poly silicon material, but not limited thereto.

As shown in FIG. 24 and FIG. 26, a first patterning process is performed on the thin film poly silicon layer 22 to form a semiconductor layer 22P in step S46. Subsequently, in step S47, a source electrode 64S and a drain electrode 64D are formed, and a second patterning process is then performed on the doped layer 23 to form a patterned doped layer 23P and a thin film transistor T4 as shown in FIG. 26. As shown in FIGS. 24-26, the gate electrode 44G and the gate insulation layer 34 are formed before the thin film poly silicon layer 22 and the doped layer 23 are formed. The source electrode 64S and the drain electrode 64D are formed after the thin film poly silicon layer 22 and the doped layer 23 are formed. The thin film transistor T4 in this embodiment may be regarded as a bottom gate poly silicon thin film transistor. It is worth noting that the patterned doped layer 23P, the source electrode 64S, and the drain electrode 64D are preferably formed by an identical process step. In other words, the second patterning process and the process of forming the source electrode 64S and the drain electrode 64D are preferably integrated in one photo lithography etching process for process simplification purpose, but not limited thereto.

Figure 27:
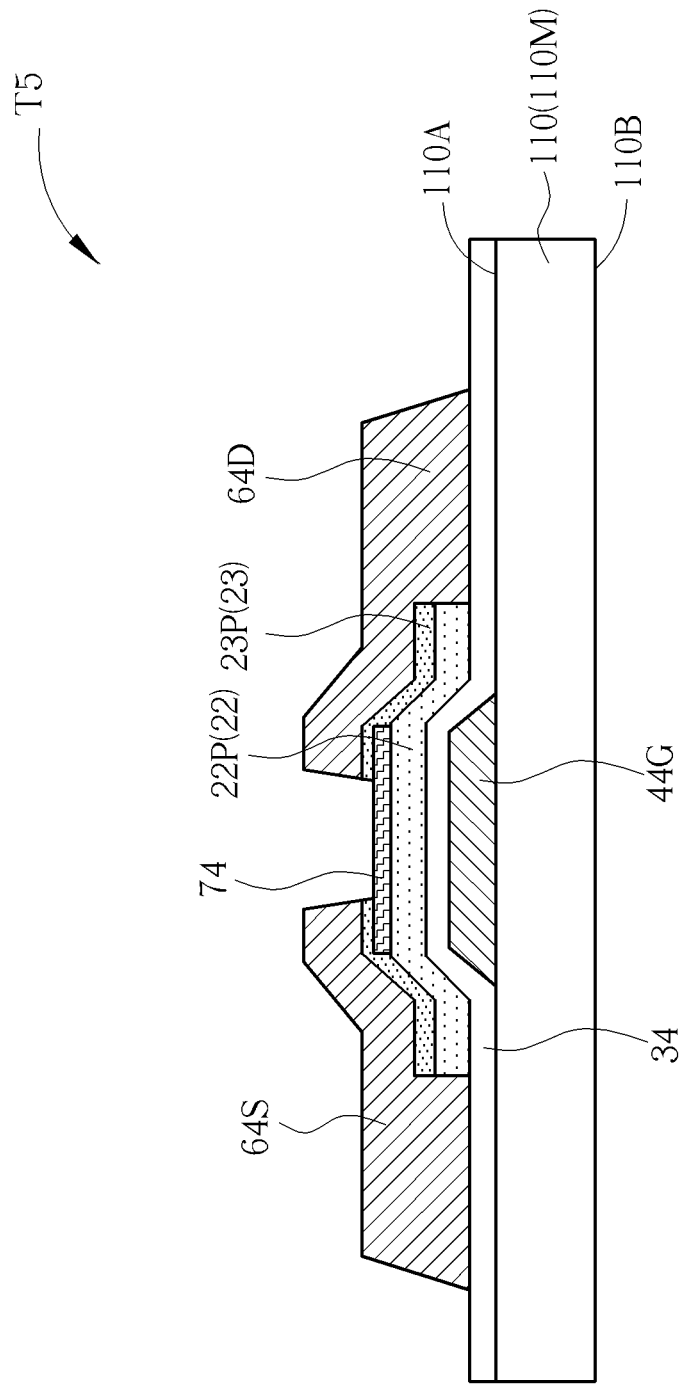
FIG. 27 is a schematic diagram illustrating a method of forming the thin film transistor according to a fourteenth preferred embodiment of the present invention.

Please refer to FIG. 27. FIG. 27 is a schematic diagram illustrating a method of forming the thin film transistor according to a fourteenth preferred embodiment of the present invention. As shown in FIG. 27, the difference between the method of forming the thin film transistor in this embodiment and the method of the thirteenth preferred embodiment is that the method of forming the thin film transistor in this embodiment further includes forming an etching stop layer 74 on the semiconductor pattern 22P. In other words, the etching stop layer 74 is formed before the doped layer 23 is formed, and the patterned doped layer 23P at least partially covers the etching stop layer 74. The etching stop layer 74 may be used to protect the semiconductor pattern 22P from being damaged during the process of forming the patterned doped layer 23P. The tolerance of process variations in the second patterning process may be accordingly enhanced, and an electrically performance of a thin film transistor T5 as shown in FIG. 27 may also be enhanced.

To summarize the above descriptions, in the method of forming the thin film poly silicon layer in the present invention, the substrate or the process environment is heated to the temperature which is high enough for directly forming the thin film poly silicon layer, and the silicon thin film deposition process is performed to directly form the thin film poly silicon layer on the substrate. Other crystallization processes after the silicon thin film deposition process will not be required accordingly. The method of forming the thin film poly silicon layer in the present invention has advantages such as reduced process time, lower cost, and higher manufacturing efficiency. In addition, the heating auxiliary layer or the lattice matching layer may be disposed in the substrate for further enhancing the heating efficiency on the surface of the substrate and further improving the crystallization quality of the thin film poly silicon layer. The method of forming the thin film poly silicon layer in the present invention may be used in a method of forming a thin film transistor, and purposes of process simplification and manufacturing cost reduction may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a thin film transistor, comprising:
   forming a thin film poly silicon layer by a method of forming a thin film poly silicon layer, wherein the method of forming the thin film poly silicon layer comprises:
   providing a substrate, having a first surface;
   performing a heating treatment; and
   performing a silicon thin film deposition process for directly forming a thin film poly silicon layer on the first surface of the substrate, wherein the heating treatment comprises:
   heating the substrate to a first temperature by a main heating source; and
   heating the first surface of the substrate to a second temperature by an auxiliary heating source, wherein the second temperature is higher than the first temperature;
   performing a first patterning process on the thin film poly silicon layer to form a semiconductor pattern;
   forming a gate electrode;
   forming a gate insulation layer; and
   forming a source electrode and a drain electrode.

2. The method of claim 1, wherein the gate insulation layer is formed after the first patterning process, and the gate electrode is formed after the gate insulation layer is formed.

3. The method of claim 2, further comprising:
   performing an ion implantation process after the gate electrode is formed so as to form a plurality of doped regions in the semiconductor pattern;
   forming a protection layer on the gate insulation layer and the gate electrode; and
   forming a plurality of first openings in the protection layer and the gate insulation layer so as to at least partially expose the doped regions, wherein the source electrode and the drain electrode contact the doped regions via the first openings.

4. The method of claim 3, further comprising performing a thermal activation process after the ion implantation process, wherein the thermal activation process is executed by a light heating method, an ion beam heating method, an electrode beam heating method, a furnace tube heating method or a filament heating method.

5. The method of claim 1, further comprising:
   forming a doped layer on the thin film poly silicon layer; and
   performing a second patterning process on the doped layer so as to form a patterned doped layer.

6. The method of claim 5, wherein the doped layer and the thin film poly silicon layer are formed in an identical silicon thin film deposition process.

7. The method of claim 5, wherein the gate insulation layer is formed after the second patterning process, and the gate insulation layer comprises a plurality of second openings at least partially exposing the patterned doped layer, wherein the source electrode and the drain electrode contact the patterned doped layer via the second openings.

8. The method of claim 7, wherein the gate electrode, the source electrode and the drain electrode are formed after the gate insulation layer is formed, and the gate electrode, the source electrode and the drain electrode are formed by an identical process.

9. The method of claim 5, wherein the patterned doped layer, the source electrode and the drain electrode are formed by an identical process, wherein the gate insulation layer is formed after the source electrode and the drain electrode are formed, and the gate insulation layer comprises a plurality of second openings at least partially exposing the source electrode and the drain electrode.

10. The method of claim 5, wherein the gate electrode and the gate insulation layer are formed before the doped layer is formed, and the source electrode and the drain electrode are formed after the doped layer is formed.

11. The method of claim 10, wherein the patterned doped layer, the source electrode and the drain electrode are formed by an identical process.

12. The method of claim 10, further comprising forming an etching stop layer on the semiconductor pattern, wherein the patterned doped layer at least partially overlaps the etching stop layer.

13. The method of claim 1, wherein the silicon thin film deposition process comprises using a reactive gaseous material to form the thin film poly silicon layer on the first surface of the substrate.

14. The method of claim 13, wherein the reactive gaseous material comprises silane ($SiH_4$) or dichlorosilane ($SiH_2Cl_2$).

15. The method of claim 1, wherein the first temperature is higher than 200 degrees Celsius and the second temperature is higher than 450 degrees Celsius.

16. The method of claim 1, wherein the second temperature is higher than 500 degrees Celsius.

17. The method of claim 1, wherein the first temperature is higher than 150 degrees Celsius, and the second temperature is higher than 250 degrees Celsius.

18. The method of claim 1, wherein the auxiliary heating source comprises a light heating source, an ion beam heating source, an electrode beam heating source, a furnace tube heating source or a filament heating source.

19. The method of claim 1, wherein the silicon thin film deposition process comprises a chemical vapor deposition (CVD) process or a physical vapor deposition (PVD) process.

20. The method of claim 1, wherein the substrate comprises a substrate basis and a heating auxiliary layer, and the heating auxiliary layer is disposed on the substrate basis.

21. The method of claim 20, wherein the heating auxiliary layer comprises graphite, chromium oxide, or molybdenum.

22. The method of claim 1, wherein the substrate comprising a substrate basis and a lattice matching layer, and the lattice matching layer is disposed on the substrate basis.

23. The method of claim 22, wherein the lattice matching layer comprises a polymer material having a specific lattice direction, an amorphous silicon layer or a metal oxide material.

24. The method of claim 22, wherein the silicon thin film deposition process comprises a plasma enhanced chemical vapor deposition (PECVD) process, a metal-organic chemical vapor deposition (MOCVD) process, or a low pressure chemical vapor deposition (LPCVD) process.

* * * * *